United States Patent
Hesse et al.

(10) Patent No.: US 10,181,786 B1
(45) Date of Patent: Jan. 15, 2019

(54) ANTI-CROSS-CONDUCTION TIME INTERVAL MINIMIZER

(71) Applicant: Silanna Asia Pte Ltd, Singapore (SG)

(72) Inventors: Kurt F. Hesse, Benson, NC (US); Jerry A. Rudiak, Raleigh, NC (US)

(73) Assignee: Silanna Asia Pte Ltd, Singapore (SG)

(*) Notice: Subject to any disclaimer, the term of this patent is extended or adjusted under 35 U.S.C. 154(b) by 21 days.

(21) Appl. No.: 15/807,414

(22) Filed: Nov. 8, 2017

(51) Int. Cl.
| | |
|---|---|
| H02M 1/38 | (2007.01) |
| H02M 3/158 | (2006.01) |
| G05F 1/56 | (2006.01) |
| H03K 19/0185 | (2006.01) |
| H02M 3/157 | (2006.01) |

(52) U.S. Cl.
CPC ........... *H02M 1/38* (2013.01); *G05F 1/56* (2013.01); *H02M 3/1588* (2013.01); *H03K 19/018564* (2013.01)

(58) Field of Classification Search
CPC . H02M 2001/0012; H02M 2001/0048; H02M 2001/0051; H02M 1/38; H02M 2001/385; H02M 3/156; H02M 3/157; H02M 3/158; H02M 3/1588
See application file for complete search history.

(56) References Cited

U.S. PATENT DOCUMENTS

| | | | |
|---|---|---|---|
| 6,396,250 B1 | 5/2002 | Bridge | |
| 6,897,682 B2* | 5/2005 | Nadd | H02M 1/088 326/27 |
| 8,970,790 B2* | 3/2015 | Murakami | H04N 5/63 323/271 |
| 9,325,241 B2* | 4/2016 | Shook | G05F 1/10 |
| 9,331,571 B2* | 5/2016 | Hsiao | H02M 3/156 |
| 9,685,868 B2* | 6/2017 | de Cremoux | H02M 3/1588 |
| 2004/0189269 A1 | 9/2004 | Lynch | |
| 2006/0152204 A1* | 7/2006 | Maksimovic | H02M 1/38 323/284 |
| 2008/0298101 A1 | 12/2008 | Kim et al. | |
| 2009/0027020 A1* | 1/2009 | Qiu | H02M 3/1588 323/282 |
| 2015/0256074 A1* | 9/2015 | Biondi | H02M 3/1588 323/271 |
| 2016/0233768 A1 | 8/2016 | de Cremoux et al. | |

OTHER PUBLICATIONS

"Low-Input Voltage-Mode Synchronous Buck Controller," Texas Instruments, Jan. 2002, revised Nov. 2005, SLUS507D, pp. 1-28.
Mappus, "Predictive Gate Drive Frequently Asked Questions," Texas Instruments, Feb. 2003, SLUA285, pp. 1-8.

* cited by examiner

*Primary Examiner* — Gary L Laxton
(74) *Attorney, Agent, or Firm* — The Mueller Law Office, P.C.

(57) ABSTRACT

A circuit for minimizing a cross-conduction time interval includes a phase node, a high-side gate drive node, a low-side gate drive node, a high-side FET coupled to the high-side gate drive node, and a low-side FET coupled to the low-side gate drive node. A high-side adjustable delay delays a transition edge of a high-side gate drive signal. A low-side adjustable delay circuit delays a transition edge of a low-side gate drive signal. A high-side delay adjustment guidance circuit provides high-side delay adjustment guidance based on a detected body-diode conduction of the low-side FET detected during a first time period. A low-side delay adjustment guidance circuit provides low-side delay adjustment guidance based on a detected body-diode conduction of the low-side FET detected during a second time period.

20 Claims, 18 Drawing Sheets

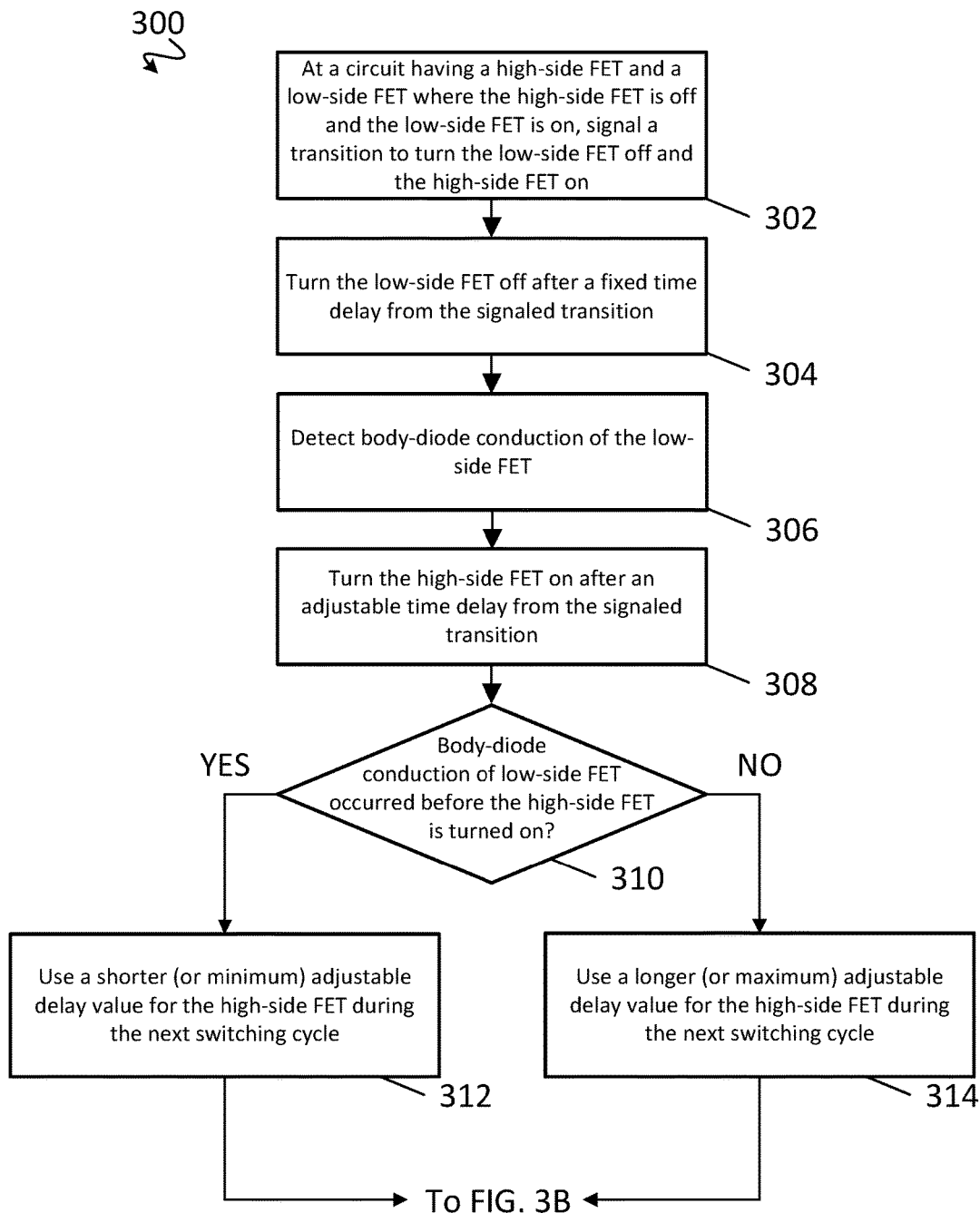

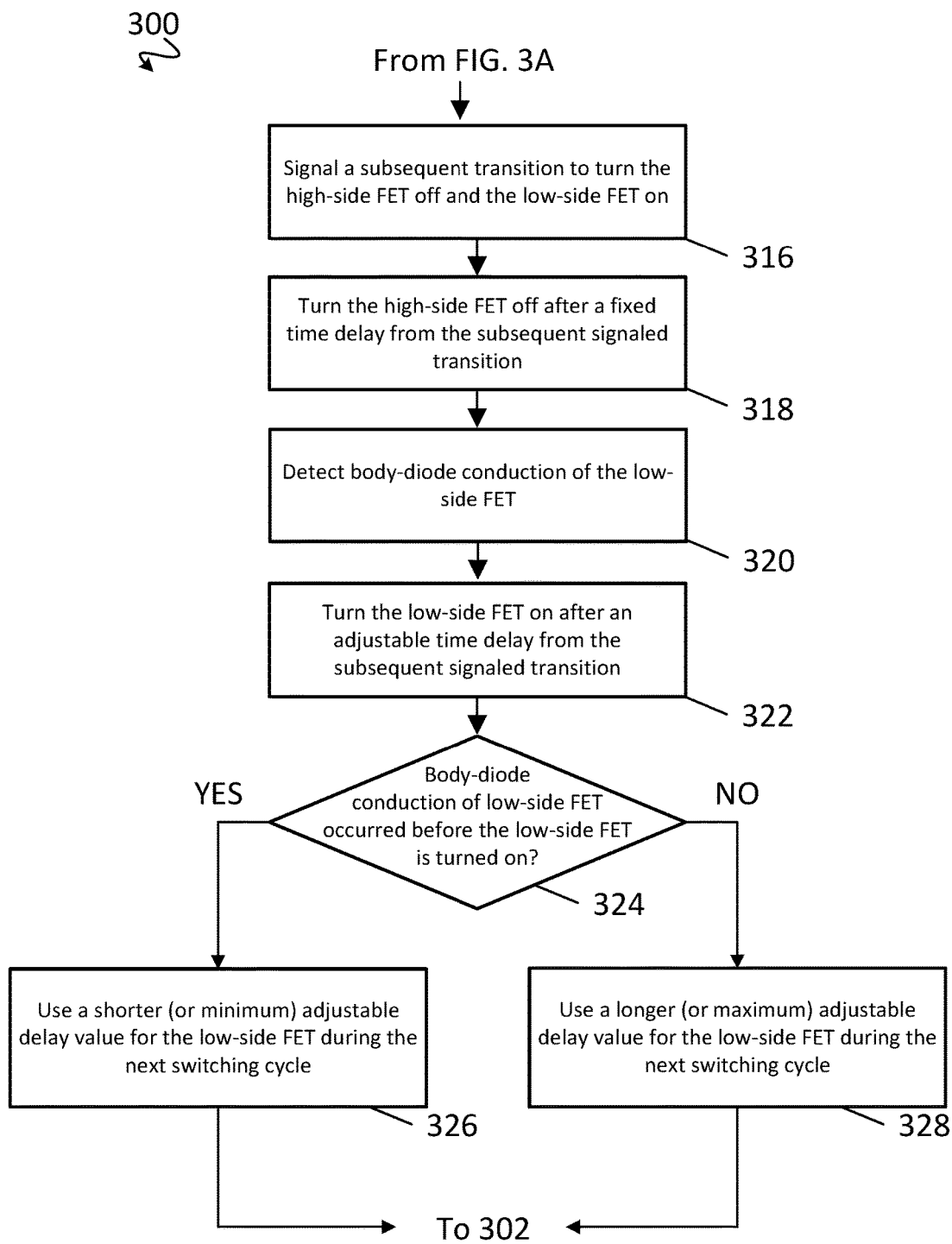

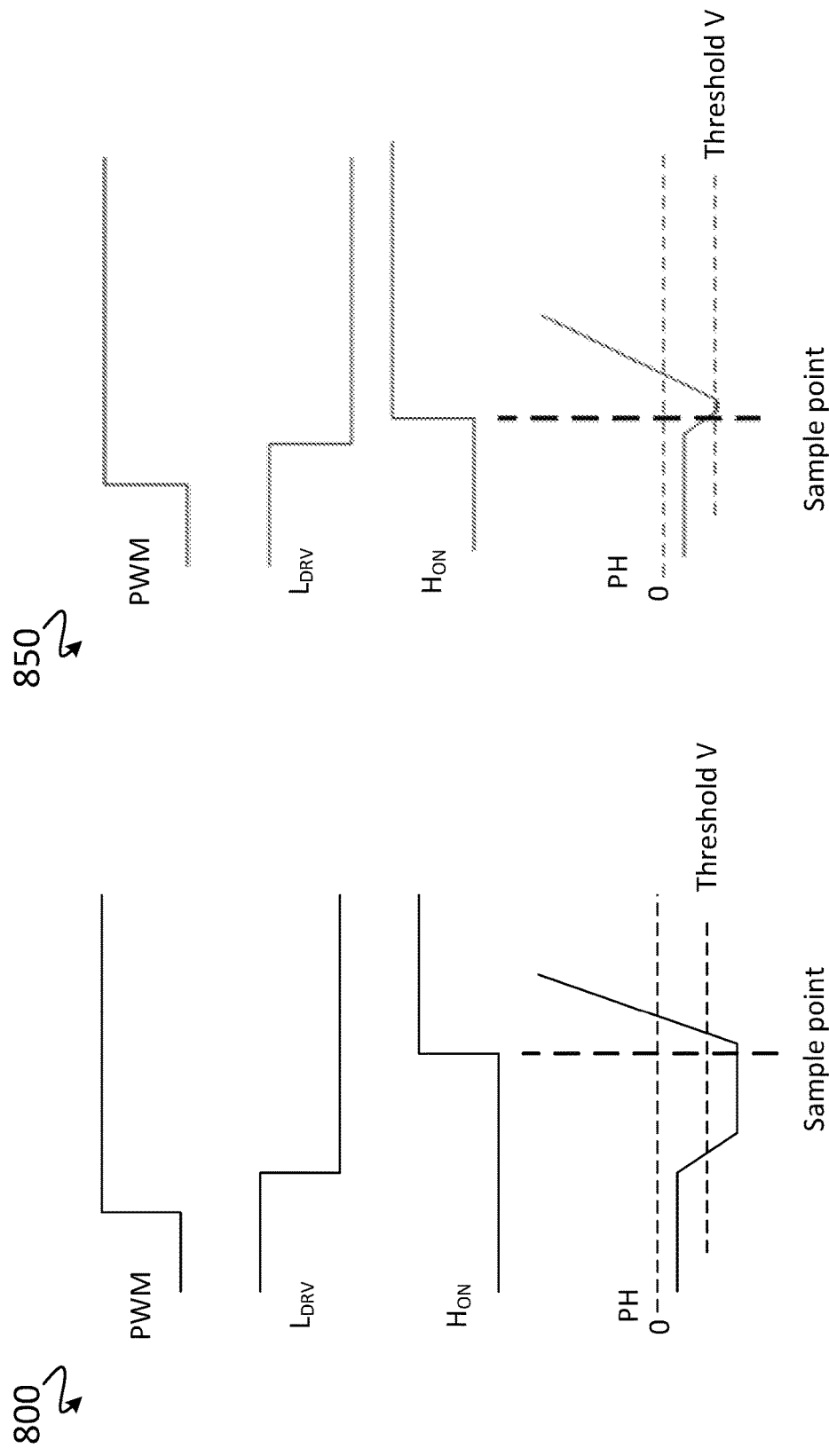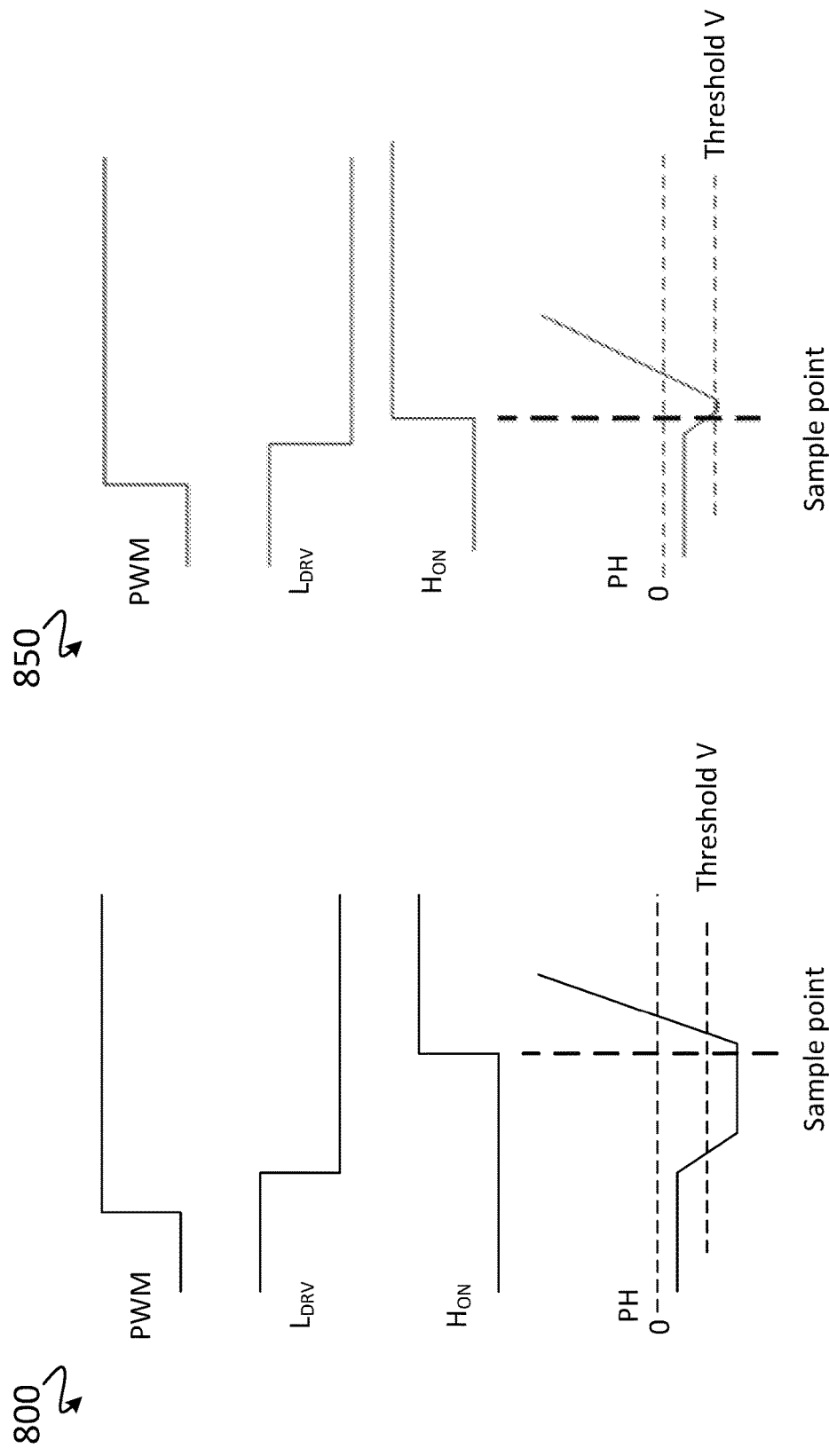

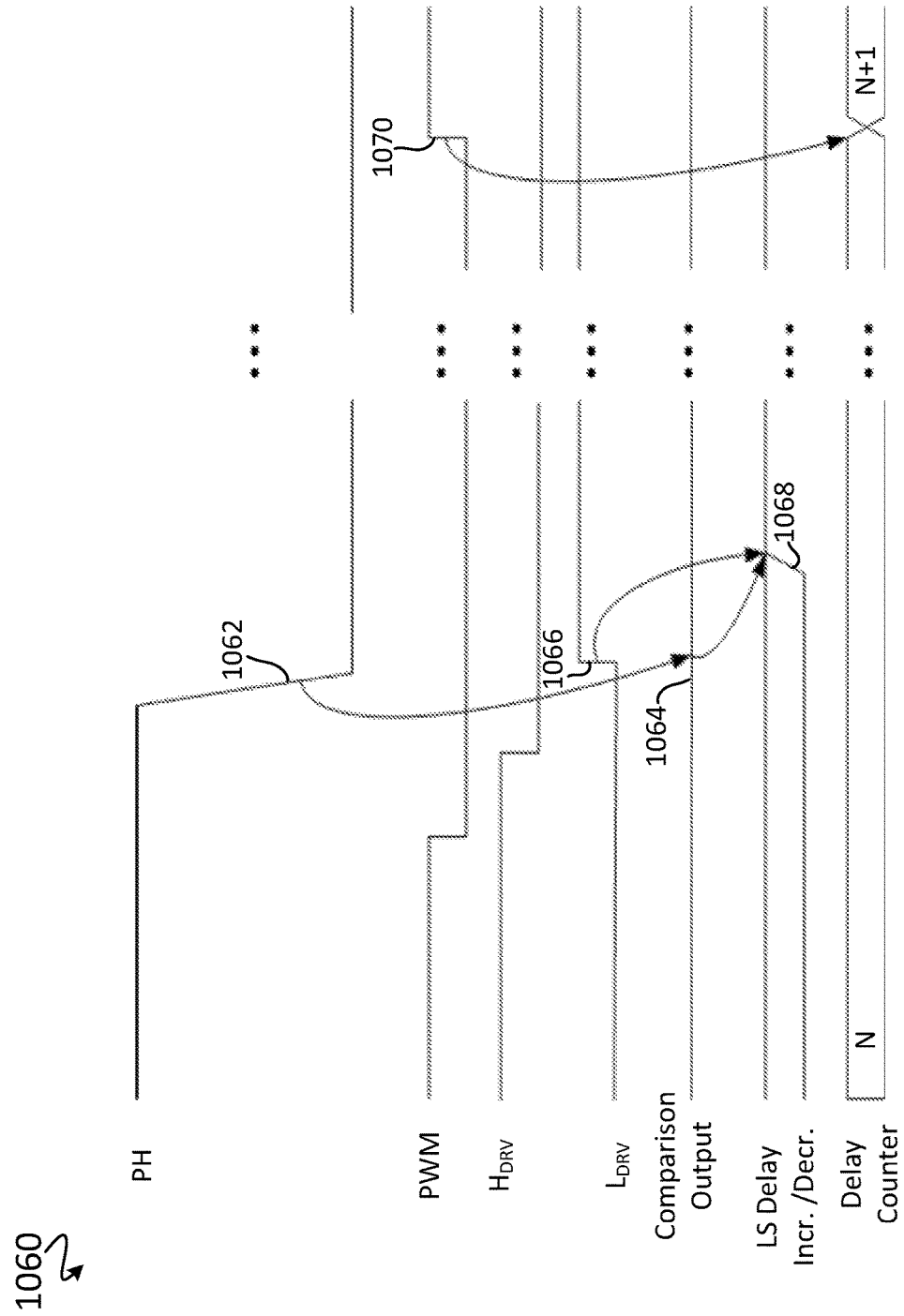

ANTI-CROSS-CONDUCTION TIME INTERVAL MINIMIZER

BACKGROUND

Electronic devices often need to generate multiple power supply rails while only being powered by a single source. For example, a laptop computer may only have a single battery but may need to produce power supply rails with different voltages for the various components on the laptop. Furthermore, regardless of the need for multiple power supply rails, electronic devices often need to condition the power that is delivered to them from an external source.

Synchronous switching power converters are a particularly efficient class of power converters that meet these requirements. For a given voltage at a voltage input of the converter, a different output voltage is produced at a voltage output of the converter. The output voltage produced is determined by the relative on-time and off-time of a control switch of the converter. During the time that the control switch of the converter is turned off, a synchronous switch of the converter is turned on.

However, if both the control switch and the synchronous switch are in an ON state simultaneously, a current path between a voltage input node of the converter and a ground node of the converter is formed. This effectively shorts the voltage input node to ground. This condition is known as cross-conduction or "shoot-through" and can cause catastrophic damage to the control switch and/or the synchronous switch. As such, both the control switch and the synchronous switch are typically transitioned to an OFF state for a time interval before the complementary switch is transitioned to an ON state. This is sometimes referred to as an anti-cross conduction interval or "dead-time." Unfortunately, while an anti-cross conduction interval is typically necessary, this interval results in inefficiencies and power loss in the converter that increase with longer anti-cross conduction interval times.

SUMMARY

In some embodiments, a circuit for minimizing an anti-cross-conduction time interval includes a phase node, a high-side gate drive node, and a low-side gate drive node. The circuit includes a high-side FET that has a high-side gate node which is communicatively coupled to the high-side gate drive node. The circuit includes a low-side FET that has a low-side gate node which is communicatively coupled to the low-side gate drive node. The high-side FET and the low-side FET are electrically coupled to the phase node. The circuit includes a high-side adjustable delay circuit that is communicatively coupled to the high-side gate drive node. The high-side adjustable delay circuit receives a high-side gate drive signal having a first signal transition edge and transmits a delayed high-side gate drive signal having a first delayed signal transition edge. The circuit includes a low-side adjustable delay circuit that is communicatively coupled to the low-side gate drive node. The low-side adjustable delay circuit receives a low-side gate drive signal having a second signal transition edge and transmits a delayed low-side gate drive signal having a second delayed signal transition edge. The circuit includes a high-side delay adjustment guidance circuit. The high-side delay adjustment circuit has a first sense input node that is electrically coupled to the phase node, a first latch input node that is communicatively coupled to the high-side gate drive node, and a first guidance signal output node that is communicatively coupled to the high-side adjustable delay circuit. A high-side delay adjustment guidance signal of the high-side delay adjustment guidance circuit is based on a detected body-diode conduction of the low-side FET detected during a first time period. The circuit includes a low-side delay adjustment guidance circuit. The low-side delay adjustment guidance circuit has a second sense input node that is electrically coupled to the phase node, a second latch input node that is communicatively coupled to the low-side gate drive node, and a second guidance signal output node that is communicatively coupled to the low-side adjustable delay circuit. A low-side delay adjustment guidance signal of the low-side delay adjustment guidance circuit is based on a detected body-diode conduction of the low-side FET detected during a second time period.

In some embodiments, a method for minimizing an anti-cross-conduction time interval involves determining if a low-side FET of a circuit is exhibiting body-diode conduction during a first time period. A delayed high-side FET gate drive signal is received at a high-side gate node of a high-side FET of a circuit. The high-side FET is coupled to a low-side FET of the circuit at a phase node of the circuit. The delayed high-side FET gate drive signal has a first rising signal transition edge that is offset in time by a high-side adjustable delay from a corresponding first rising signal transition edge of a high-side gate drive signal. If it is determined that the low-side FET exhibited body-diode conduction during the first time period, a high-side adjustable delay circuit is configured to decrease the high-side adjustable delay. The decreased high-side adjustable delay is used in a subsequent switching cycle. If it is determined that the low-side FET did not exhibit body-diode conduction during the first time period, the high-side adjustable delay circuit is configured to increase the high-side adjustable delay. The increased high-side adjustable delay is used in a subsequent switching cycle. It is determined if the low-side FET is exhibiting body-diode conduction during a second time period. A delayed low-side FET gate drive signal is received at a low-side gate node of a low-side FET of the circuit. The delayed low-side FET gate drive signal has a second rising signal transition edge that is offset in time from a corresponding second rising signal transition edge of a low-side gate drive signal. If it is determined that the low-side FET exhibited body-diode conduction during the second time period, a low-side adjustable delay circuit is configured to decrease the low-side adjustable delay. The decreased low-side adjustable delay is used in a subsequent switching cycle. If it is determined that the low-side FET did not exhibit body-diode conduction during the second time period, the low-side adjustable delay circuit is configured to increase the low-side adjustable delay. The increased low-side adjustable delay is used in a subsequent switching cycle.

BRIEF DESCRIPTION OF THE DRAWINGS

FIGS. 3A-B are a flowchart of a simplified process for minimizing an anti-cross conduction interval of a synchronous switching power converter circuit, in accordance with some embodiments.

FIGS. 8A-B are simplified signal timing diagrams.

FIGS. 10A-D are simplified signal timing diagrams.

DETAILED DESCRIPTION

Improved methods and circuits are described herein for minimizing anti-cross-conduction intervals and thereby minimizing body-diode conduction of synchronous switching power converters. Such methods and circuits involve high-speed measurement circuits for sensing conditions of a synchronous bridge of a synchronous switching converter during a switching cycle and using results from the sensed conditions during a subsequent switching cycle. An advantage over conventional circuits is that the sensed conditions are used to minimize the required anti-cross-conduction interval in the synchronous bridge, thereby minimizing losses and maximizing efficiency. Such improved methods and circuits differ from conventional reactive techniques in that the improved methods and circuits presume that changes in operating conditions from one switching cycle to the next in a synchronous bridge will have minimal changes to the required timing for optimal drive timing. Thus, measurements made during a switching cycle are advantageously used to minimize the anti-cross-conduction interval used in a subsequent switching cycle. In some embodiments, timing adjustments are further advantageously made in small increments to slowly "close in" on optimal anti-cross-conduction interval timing. Under some circumstances, such as circuit fault, further action is called for, as described below. In accordance with advantages of some embodiments, a first body-diode detection circuit is used during a time period that occurs after a low-side FET has turned off and before a high-side FET has turned on. Additionally, a second body-diode detection circuit is used during a time period that occurs after the high-side FET has turned off and before the low-side FET has turned on. Additional benefits, advantages, and improvements will become apparent from the description herein. Although example embodiments describe buck-type synchronous power regulators, the circuits and techniques described herein can be used for other power regulator topologies.

Figure 1:
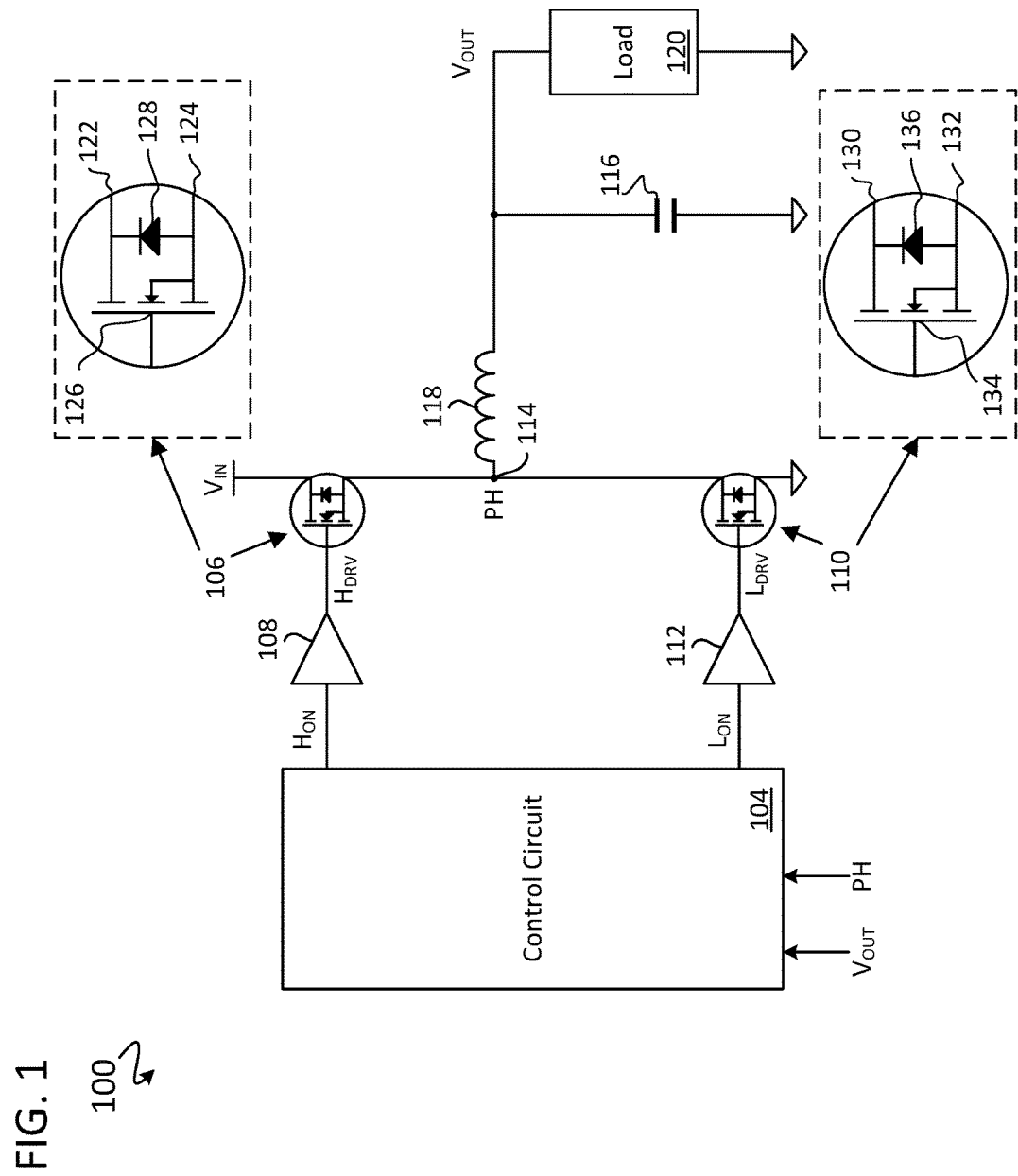
FIG. 1 is a simplified schematic of an example synchronous switching power converter circuit, in accordance with some embodiments.

FIG. 1 is a simplified schematic of an example synchronous switching power converter ("converter") circuit 100 that converts an input voltage $V_{IN}$ at a $V_{IN}$ node to an output voltage $V_{OUT}$ at a $V_{OUT}$ node, in accordance with some embodiments. In general, the converter 100 includes a control circuit 104 that is coupled to a high-side field effect transistor (FET) 106 through a high-side drive circuit 108. The control circuit 104 is also coupled to a low-side FET 110 through a low-side drive circuit 112. A high-side source node 124 of the high-side FET 106, and a low-side drain node 130 of the low-side FET 110 are electrically coupled to the phase node 114, which is electrically coupled to a capacitor 116 through an inductor 118. A phase signal PH is a static or continuously changing voltage at the phase node 114. The control circuit 104 is electrically coupled to the phase node 114 to receive the phase signal PH. A load, such as a load 120, is typically electrically coupled in parallel with the capacitor 116. In some embodiments, the control circuit 104 is electrically coupled to the $V_{OUT}$ node (e.g., through a feedback path to receive $V_{OUT}$). The control circuit 104 receives $V_{OUT}$ and the phase signal PH and may receive other signals which are not shown here for simplicity. The control circuit 104 outputs a signal $H_{ON}$ and a signal $L_{ON}$. The high-side drive circuit 108 receives the $H_{ON}$ signal. The high-side drive circuit 108 buffers, amplifies, level-shifts, or otherwise conditions the signal $H_{ON}$ to produce a signal $H_{DRV}$ that is suitable for turning the high-side FET 106 on and off. Similarly, the low-side drive circuit 112 receives the signal $L_{ON}$. The low-side drive circuit 112 buffers, amplifies, level-shifts, or otherwise conditions the signal $L_{ON}$ to produce a signal $L_{DRV}$ that is suitable for turning the low-side FET 110 on and off. A circuit leg of the converter 100 that includes the FETs 106, 110 is sometimes referred to as a "synchronous bridge," or a "power bridge." The high-side FET 106 is sometimes referred to as a "control switch," the low-side FET 110 is sometimes referred to as a "synchronous switch," and the phase node 114 is sometimes referred to as a "switch node."

As shown in the magnified view of the high-side FET 106, the high-side FET 106 includes a high-side drain node 122, the high-side source node 124, a high-side gate node 126, and an intrinsic high-side body-diode 128. Similarly, the low-side FET 110 includes the low-side drain node 130, a low-side source node 132, a low-side gate node 134, and an intrinsic low-side body-diode 136. An intrinsic body-diode ("body-diode") is a diode formed in a body-drain p-n junction of a FET between a source node and a drain node of the FET. When the body-diode is biased into a forward condition, current will flow from the source node to the drain node through the body-diode. This is sometimes referred to as "body-diode conduction."

When either of the FETS 106, 110 is in an ON state, a conduction channel forms between the drain node and the source node of that FET, enabling current to flow bi-directionally (depending on a voltage potential across the drain node and the source node) between the drain node and source node of that FET. This is sometimes referred to as "channel conduction." When either of the FETS 106, 110 is in an OFF state, the conduction channel is "broken," and current no longer flows in the conduction channel.

When the high-side FET 106 is in an ON state, it is advantageous that the low-side FET 110 be in an OFF state to prevent cross-conduction. Cross-conduction is sometimes referred to as "shoot-through." Cross-conduction occurs when both of the FETs 106, 110 are simultaneously in an ON state, and current can flow directly from the $V_{IN}$ node to a ground node. Cross-conduction causes efficiency losses and can result in damage to, or the destruction of, the FETs 106, 110. Thus, the control circuit 104 typically transitions both of the FETs 106, 110 through an OFF state before turning either of the FETs 106, 110 on (e.g., "break before make"). The interval of time while the FETS 106, 110 are both turned off is referred to as an anti-cross-conduction interval, or "dead-time."

When both of the FETs 106, 110 are in an OFF state during the anti-cross-conduction interval, a voltage at the phase node 114 may fall to a voltage such that the low-side body-diode 136 of the low-side FET 110 is biased into a forward condition. This will cause current to flow from the ground node to the load 120 through the low-side body-diode 136. The resultant diode drop across the low-side body-diode 136 causes a significant loss in efficiency of the switching power converter 100. Thus, though an anti-cross-conduction interval is typically necessary to prevent cross-conduction, it presents an undesired loss mechanism in synchronous switching power converters that increases with longer anti-cross-conduction intervals. There is a need to control the ON and OFF states of the FETs 106, 110 such that the anti-cross-conduction interval is long enough that cross-conduction is prevented, yet short enough to minimize efficiency losses due to body-diode conduction.

Some common schemes to decrease such losses use a fixed anti-cross-conduction interval. The use of fixed anti-cross-conduction intervals is most effective under closely constrained circuit conditions (e.g., constrained by the size of the FETs 106, 110, by the packaging of those devices, and by the parasitic impedances around the drive circuits that affect turn on and turn off times of the FETs 106, 110 relative to transition signal timing). Other common schemes use an adaptive technique, where the conditions in the synchronous bridge are measured, and then actions are immediately taken based on those measurements. This adaptive technique is more amenable to widely varying bridge conditions, or to situations where there is little constraint placed on the synchronous bridge, such as might be seen by a driver intended for generic applications. However, as switching frequencies of converters increase, required or targeted dead times decrease and "reactionary" techniques which rely on the ability to take immediate action become increasingly difficult. For example, a synchronous switching power converter with a target dead time of 3 to 4 ns or less has little time to take measurements and take immediate action. Thus, reactionary techniques are inherently limited by the speed of the measuring circuits. This limits the total possible reduction of the anti-cross-conduction interval in the converter, which in turn limits the degree to which efficiency can be gained.

In contrast with the above described reactionary techniques, circuits, and methods in accordance with some embodiments, as described herein, can be conceptualized as embodying a "high-side" state machine and a "low-side" state machine implemented by a control circuit, such as a control circuit 104 which will be discussed with reference to FIG. 4. A state diagram of FIG. 2A of the high-side state machine 200, and a state diagram of FIG. 2B of the low-side state machine 250 are generally identical except for the condition used to detect body-diode conduction of the low-side FET 110 and the time period during which detection occurs.

These state machines 200 and 250 independently control delay durations used for controlling the high-side and low-side FETs 106, 110 respectively. Conceptually, the high-side state machine 200 controls an adjustable time delay between turning the low-side FET 110 off and turning the high-side FET 106 on. The low-side state machine 250 independently controls an adjustable time delay between turning the high-side FET 106 off and turning the low-side FET 110 on. In some embodiments, the high-side state machine 200 adjusts (e.g., increases or decreases) a high-side adjustable delay based on detecting the beginning of body-diode conduction of the low-side FET 110 using signals (e.g., the phase signal PH) received from the phase node 114. This detection is conducted during a time period that occurs after the low-side FET 110 turns off and before the high-side FET 106 turns on. In some embodiments, the low-side state machine 250 adjusts (e.g., increases or decreases) a low-side adjustable delay based on detecting the beginning of body-diode conduction of the low-side FET 110 using signals (e.g., the phase signal PH) received from the phase node 114. This detection is conducted during a time period that occurs after the high-side FET 106 turns off and before the low-side FET 110 turns on.

A power-on-reset (POR) event initializes the high-side state machine 200 to state A. At state A, a high-side adjustable delay is initialized to a predetermined delay value (e.g., a maximum acceptable delay). The high-side adjustable delay is a portion of a delay applied to a signal used to turn the high-side FET 106 on.

During the time between the turn-off of the low-side FET 110 and the turn-on of the high-side FET 106, body conduction of the low-side FET 110 could occur. If body-diode conduction of the low-side FET 110 is detected the high-side state machine 200 transitions to state B. For each switching cycle in which body-diode conduction of the low-side FET 110 is detected, the high-side state machine 200 decreases the high-side adjustable delay used during a subsequent switching cycle. If while at state B body-diode conduction of the low-side FET 110 is not detected, the high-side state machine 200 transitions to state C. For each switching cycle in which body-diode conduction of the low-side FET 110 is not detected, the high-side state machine 200 increases the high-side adjustable delay used during a subsequent switching cycle. If while at state C body-diode conduction of the low-side FET 110 is detected, the high-side state machine 200 transitions back to state B.

Typically, the transition from state A to state C should not occur, because at state A the high-side adjustable delay has been initialized to the predetermined delay value. The predetermined delay value is considered a maximum value, and thus should not be further increased. Additionally, if a fault is detected while the high-side state machine 200 is at state B or state C, the high-side state machine 200 transitions to state A. At state A, the high-side adjustable delay is re-initialized to the predetermined delay value (or, in some embodiments, to another delay value).

Figure 2A:
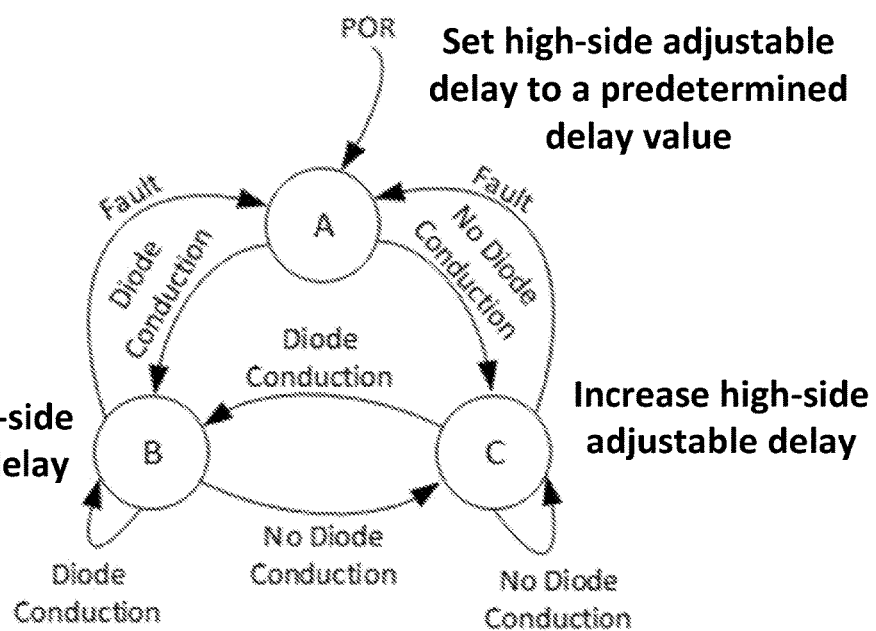
FIGS. 2A-B are simplified state diagrams of a synchronous switching power converter circuit that minimizes an anti-cross conduction interval, in accordance with some embodiments.
Figure 2B:
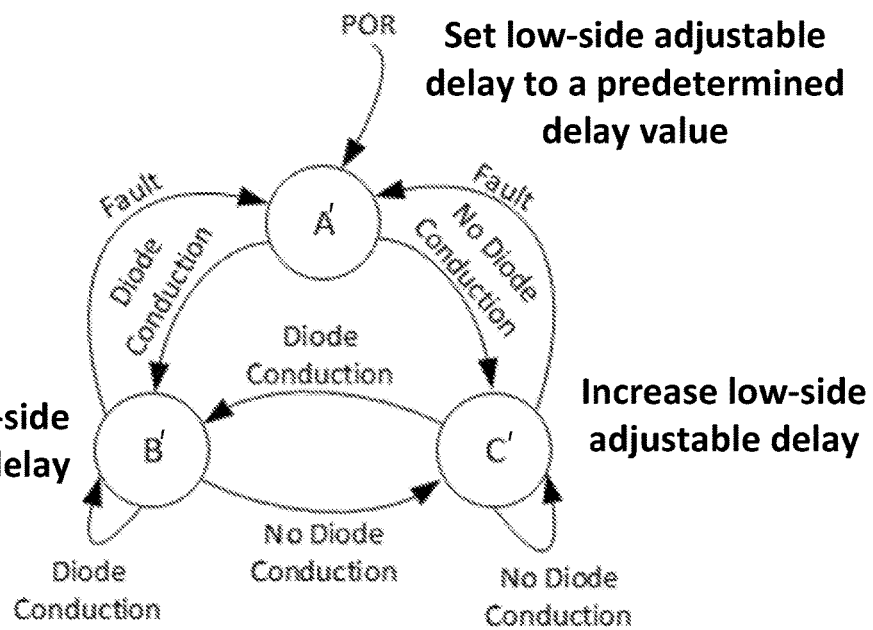

Attention is now turned to the state machine 250 shown in FIG. 2B. A POR event initializes the low-side state machine 250 to state A'. At state A', a low-side adjustable delay used for turning on the low-side FET 110 is initialized to a predetermined delay value (e.g., a maximum acceptable delay). The low-side adjustable delay is a portion of a delay applied to a signal used to turn the low-side FET 110 on. During the portion of time between the turn off of the high-side FET 106 and the turn-on of the low-side FET 110, body-diode conduction of the low-side FET 110 can potentially occur. The presence, absence, or imminence of body-diode detection of the low-side FET 110 is detected during a time period that occurs after the high-side FET 106 turns off and before the low-side FET 110 turns on. If body-diode conduction of the low-side FET 110 is detected, the low-side state machine 250 transitions to state B' during a subsequent switching cycle. For each switching cycle in which body-diode conduction of the low-side FET 110 is detected, the low-side state machine 250 decreases the low-side adjustable delay used during a subsequent switching cycle. If, while at state B', body-diode conduction of the low-side FET 110 is not detected, the low-side state machine 250 transitions to state C'. For each switching cycle in which body-diode conduction of the low-side FET 110 is not detected, the low-side state machine 250 increases the low-side adjustable delay used during a subsequent switching cycle. If, while at state C', body-diode conduction of the low-side FET 110 is detected, the low-side state machine 250 transitions back to state B'.

Typically, the transition from state A' to state C' should not occur because at state A' the low-side adjustable delay has been initialized to a predetermined delay value, since the predetermined delay value is considered a maximum value, and thus should not be further increased. Additionally, if a fault is detected while the low-side state machine 250 is at state B' or state C', the low-side state machine 250 transitions to state A'. At state A', the low-side adjustable delay is re-initialized to the predetermined delay value (or, in some embodiments, to another delay value).

In some embodiments, a "clock" of the state machines 200 and 250 is a PWM signal of the control circuit 104 that is used to control the timing of the switching of the FETs 106 and 110. This additional use of the PWM signal as the clock for the state machines 200 and 250 results in one state transition per switching cycle.

FIGS. 3A-B illustrate a simplified process 300 for minimizing an anti-cross-conduction interval of the synchronous switching power converter 100, in accordance with some embodiments. In some embodiments, all or a portion of the simplified process 300 is implemented using the synchronous switching power converter 100, and a control circuit 104 similar to that shown and described with reference to FIG. 4. Directly before step 302, the high-side FET 106 of the converter ("circuit") 100 is off, and the low-side FET 110 is on. At step 302, a transition is signaled to turn the low-side FET 110 off and the high-side FET 106 on (e.g., by a rising edge of the PWM signal). The low-side FET 110 is turned off at step 304 by the control circuit 104 after a fixed time delay from the signaled transition. At step 306, the presence, absence, or imminence of body-diode conduction of the low-side FET 110 is detected. The high-side FET 106 is turned on at step 308 by the control circuit 104 after an adjustable time delay from the signaled transition. At step 310, if body-diode conduction of the low-side FET 110 occurred at step 306, flow continues to step 312. At step 312, the high-side adjustable delay is decreased, so that a shorter (or minimum) high-side adjustable delay value is used when transitioning the high-side FET 106 into an ON state during the next switching cycle. A switching cycle is a period of time in which both of the FETs 106, 110 have transitioned through full ON and OFF states (e.g., the sequence of turning low-side FET 110 OFF . . . high-side FET 106 ON . . . high-side FET 106 OFF . . . low-side FET 110 ON . . . low-side FET 110 OFF . . . ). At step 310, if body-diode conduction of the low-side FET 110 did not occur at step 306, flow continues to step 314. At step 314, the high-side adjustable delay is increased, so that a longer (or maximum) high-side adjustable delay value is used when transitioning the high-side FET 106 into an ON state during the next switching cycle.

Turning attention to FIG. 3B, at step 316, a subsequent transition is signaled to turn the high-side FET 106 off and the low-side FET 110 on (e.g., by a falling edge of the PWM signal). The high-side FET 106 is turned off at step 318 by the control circuit 104 after a fixed time delay from the subsequent signaled transition. At step 320, the presence, absence, or imminence of body-diode conduction of the low-side FET 110 is detected. The low-side FET 110 is turned on at step 322 by the control circuit 104 after an adjustable time delay from the subsequent signaled transition. At step 324, if body-diode conduction of the low-side FET 110 occurred at step 320, flow continues to step 326. At step 326, the low-side adjustable delay is decreased, so that a shorter (or minimum) low-side adjustable delay value is used when transitioning the low-side FET 110 into an ON state during the next switching cycle. At step 324, if body-diode conduction of the low-side FET 110 did not occur at step 320, flow continues to step 328. At step 328, the low-side adjustable delay is increased, so that a longer (or maximum) low-side adjustable delay value is used when transitioning the low-side FET 110 into an ON state during the next switching cycle.

Figure 4:
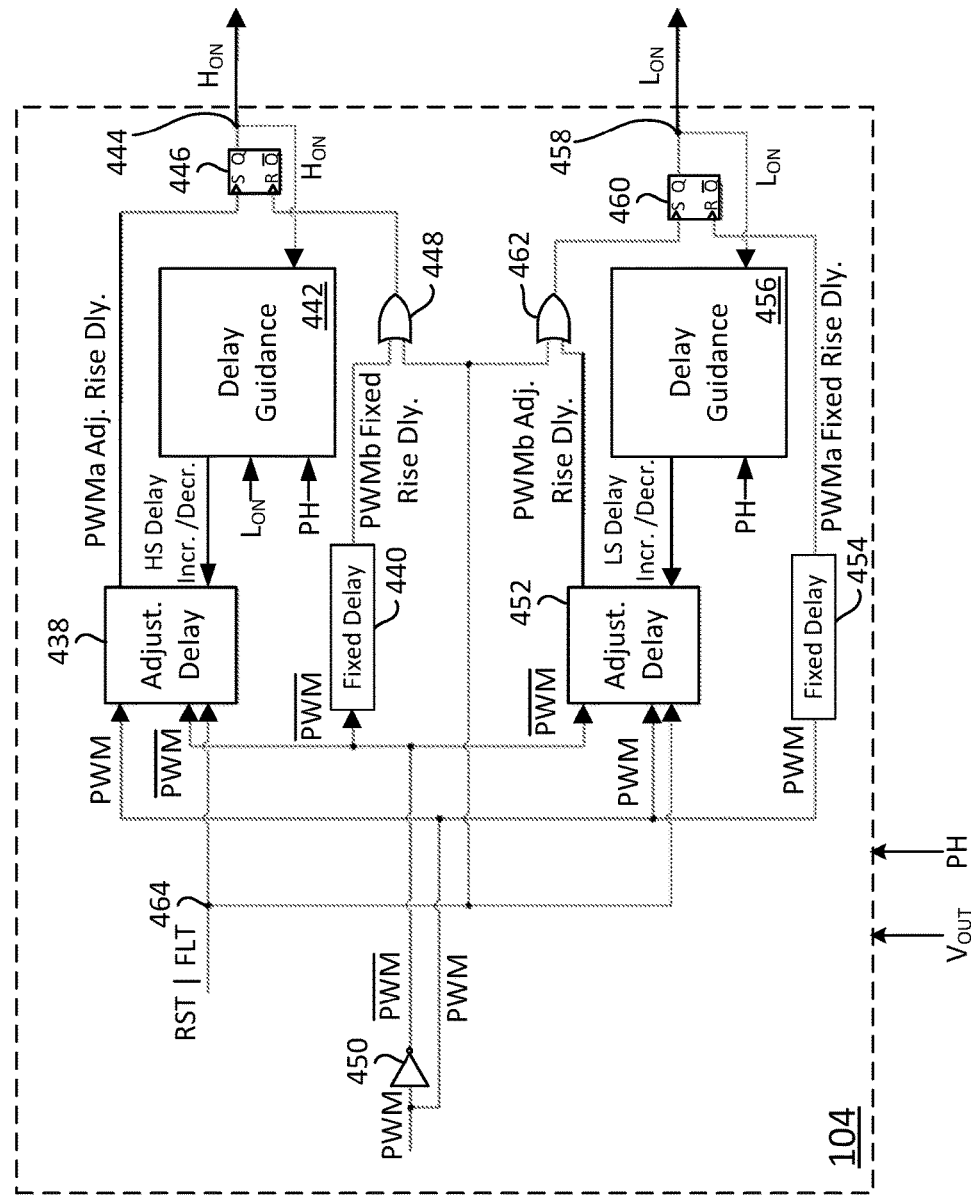
FIG. 4 is a simplified schematic of an example control circuit that minimizes an anti-cross conduction interval, in accordance with some embodiments.

FIG. 4 is a simplified schematic of the example control circuit 104 of the converter 100 introduced in FIG. 1, in accordance with some embodiments. The control circuit 104 implements all or a portion of the simplified example process 300, in accordance with some embodiments. Some elements of the control circuit 104 have been omitted from the simplified circuit schematic for clarity (e.g., elements typical to synchronous switching power converters, such as a PWM generator, a voltage feedback loop, an error amplifier, a power-on-reset controller, etc.).

The control circuit 104 generally includes a high-side adjustable delay circuit 438, a high-side fixed delay circuit 440, a high-side delay guidance circuit 442, a high-side gate drive node 444, a positive edge triggered high-side gate drive signal latch circuit ("high-side drive latch") 446, a high-side OR gate 448, an inverter 450, a low-side adjustable delay circuit 452, a low-side fixed delay circuit 454, a low-side delay guidance circuit 456, a low-side gate drive node 458, a positive edge triggered low-side gate drive signal latch circuit ("low-side drive latch") 460, and a low-side OR gate 462. A delay guidance circuit is a circuit that directs an adjustable delay circuit to increase or decrease an adjustable delay based on factors measured and/or determined by the delay guidance circuit.

The high-side gate node 126 of the high-side FET 106 is communicatively coupled to the high-side gate drive node 444 (e.g., through the high-side drive circuit 108). The low-side gate node 134 of the low-side FET 110 is communicatively coupled to the low-side gate drive node 458 (e.g., through the low-side drive circuit 112). The high-side adjustable delay circuit 438 is communicatively coupled to the high-side gate drive node 444 (through the high-side drive latch circuit 446), and the low-side adjustable delay circuit 452 is communicatively coupled to the low-side gate drive node 458 (through the low-side drive latch circuit 460 and the low-side OR gate 462). Additionally, the high-side fixed delay circuit 440 is communicatively coupled to the high-side gate drive node 444 (through the high-side drive latch circuit 446 and the high-side OR gate 448), and the low-side fixed delay circuit 454 is communicatively coupled to the low-side gate drive node 458 (through the low-side drive latch circuit 460). Two or more nodes being "communicatively coupled" means that electrical signals, logic signals, command signals, electromagnetic signals, optical signals, electrical current, and/or other signals can be exchanged unidirectionally or bidirectionally between one node and one or more other nodes. Two or more nodes being "electrically coupled" means that electrical current and/or other signals can be exchanged unidirectionally or bidirectionally between one node and one or more other nodes.

As shown, a low-side/high-side adjustable delay and a low-side/high-side fixed delay of the control circuit 104 control the anti-cross-conduction interval between state transitions (ON/OFF) of the FETS 106, 110. In the example shown, a pulse-width-modulation ("PWM") signal is used as a high-side gate drive signal, and an inverted form of the PWM ("$\overline{\text{PWM}}$") signal is used as a low-side gate drive signal. When PWM is de-asserted, the inverted form $\overline{\text{PWM}}$ is asserted and vice-versa. A gate drive signal is a signal that directly or indirectly (e.g., through intervening circuitry or logic) causes a FET to turn on or off depending on the respective asserted or de-asserted state of the gate drive signal. A rising edge of the PWM signal signals a transition to turn the low-side FET 110 off and to turn the high-side FET 106 on. A falling edge of the PWM signal signals a transition to turn the high-side FET 106 off and to turn the low-side FET 110 on.

At an initial time, the high-side FET 106 is in an OFF state, and the low-side FET 110 is in an ON state. A rising transition edge of the PWM signal signals a transition to turn the low-side FET 110 off and to turn the high-side FET 106 on.

To turn the low-side FET 110 off, the low-side fixed delay circuit 454 receives the PWM signal and delays the rising transition edge of the PWM signal by a low-side fixed delay amount, and transmits a delayed signal ("PWMa Fixed Rise Dly.") to a RESET input ("R") of the low-side drive latch circuit 460. A rising transition edge of PWMa Fixed Rise Dly. causes the low-side drive latch circuit 460 to de-assert the signal $L_{ON}$ at the output Q of the low-side drive latch circuit 460. The low-side drive circuit 112 stops driving the low-side gate node 134 to turn the low-side FET 110 off. Example latch circuits which are similar to the low-side drive latch circuit 460 and the high-side drive latch circuit 446 are described with reference to FIGS. 6B-C.

To turn the high-side FET 106 on, the high-side adjustable delay circuit 438 receives the PWM signal, delays the rising transition edge of the PWM signal by a high-side adjustable delay, and transmits a delayed high-side gate drive signal ("PWMa Adj. Rise Dly.") to a SET input ("S") of the high-side drive latch circuit 446. Upon receiving a rising transition edge at S, the high-side drive latch circuit 446 latches an asserted state of signal $H_{ON}$ at the output Q of the high-side drive latch circuit 446 and thereby at the high-side gate drive node 444. Accordingly, the high-side drive circuit 108 drives the high-side gate node 126 of the high-side FET 106 with an asserted signal $H_{DRV}$ to turn the high-side FET 106 on. That is, the high-side drive circuit 108 receives the signal $H_{ON}$, shifts $H_{ON}$ in voltage, and amplifies, buffers, and/or otherwise conditions $H_{ON}$ to produce the signal $H_{DRV}$, which is suitable for driving the high-side gate node 126.

After a duration of time, a falling edge of the PWM signal signals a transition to turn the high-side FET 106 off and to turn the low-side FET 110 on.

To turn the high-side FET 106 off, the high-side fixed delay circuit 440 receives the $\overline{\text{PWM}}$ signal from the inverter 450. The high-side fixed delay circuit 440 delays a rising transition edge of the $\overline{\text{PWM}}$ signal (caused by PWM falling) by a high-side fixed delay amount, and transmits a delayed signal ("PWMb Fixed Rise Dly.") to a RESET input ("R") of the high-side drive latch circuit 446. A rising transition edge of PWMb Fixed Rise Dly. causes the high-side drive latch circuit 446 to de-assert the signal $H_{ON}$ at the output Q of the high-side drive latch circuit 446. When the output Q is de-asserted, the high-side drive circuit 108 accordingly stops driving the high-side gate node 126 of the high-side FET 106, causing the high-side FET 106 to turn off.

To turn the low-side FET 110 on, the low-side adjustable delay circuit 452 receives the $\overline{\text{PWM}}$ signal from the inverter 450, delays a rising transition edge of the $\overline{\text{PWM}}$ signal (caused by PWM falling) by a low-side adjustable delay, and transmits a delayed low-side gate drive signal ("PWMb Adj. Rise Dly.") to a SET input ("S") of the low-side drive latch circuit 460. Upon receiving a rising transition edge at S, the low-side drive latch circuit 460 latches an asserted state of signal $L_{ON}$ at the output Q of the low-side drive latch circuit 460 and thereby at the low-side gate drive node 458. The low-side drive circuit 112 receives the signal $L_{ON}$, shifts $L_{ON}$ in voltage, and amplifies, buffers, and/or otherwise conditions $L_{ON}$ to produce the signal $L_{DRV}$ which is suitable for driving the low-side gate node 134. Accordingly, the low-side drive circuit 112 drives the low-side gate node 134 of the low-side FET 110 with an asserted signal $L_{DRV}$ to turn the low-side FET 110 on.

As was described with reference to FIG. 2A, the high-side adjustable delay produced by the high-side adjustable delay circuit 438 is increased or decreased based on a determination of body-diode conduction of the low-side FET 110. This determination is conducted during a time period that occurs after the low-side FET 110 has turned off and before the high-side FET 106 has turned on. The adjusted high-side adjustable delay value based on this determination is used during a subsequent switching cycle. The high-side delay guidance circuit 442 has a sense input node that is electrically coupled to the phase node 114 and a latch input node that is communicatively coupled to the high-side gate drive node 444. In some embodiments, another latch input node of the high-side delay guidance circuit 442 is communicatively coupled to the low-side gate drive node 458 to receive the $L_{ON}$ signal. A guidance signal output node of the high-side delay guidance circuit 442 is communicatively coupled to the high-side adjustable delay circuit 438. The high-side delay guidance circuit 442 uses signals received at the sense input node from the phase node 114 (signal PH), signals received at the latch input node from the high-side gate drive node 444 (signal $H_{ON}$), and in some embodiments, signals received at the other latch input node from the low-side gate drive node 458 (signal $L_{ON}$), to detect body-diode conduction of the low-side FET 110 and control the latched state of the determination. Based on the presence or absence of detected body-diode conduction, the high-side delay guidance circuit 442 generates a high-side delay adjustment guidance signal, which is designated as HS Delay Incr./Decr. Example embodiments of the high-side delay guidance circuit 442 are described with reference to FIG. 7A and FIG. 9.

At startup, the adjustable delays of the adjustable delay circuits 438, 452 are set to a respective maximum delay value and generally remain that way until after a soft start. This allows the converter 100 to stabilize before releasing the transient that the converter 100 experiences on initial startup. Similarly, after a fault (as indicated by signal FLT) or reset (as indicated by signal RST) received at a reset signal node 464, the adjustable delays of the adjustable delay circuits 438, 452 are set to respective maximum delay values. The OR gates 448, 462 facilitate fault reset and in some embodiments are additionally configured to set or reset $H_{ON}$ and/or $L_{ON}$. In some embodiments, the adjustable delays are only allowed to converge back to optimal after the soft start period of the restart. In some embodiments, the $H_{ON}$ signal and the $L_{ON}$ signal are not allowed to overlap. This is a minimum off-time requirement and is dependent on the fixed delays selected.

As was described with reference to FIG. 2B, the low-side adjustable delay produced by the low-side adjustable delay circuit 452 is also increased or decreased based on a determination of body-diode conduction of the low-side FET 110. The method and/or circuitry used to perform this determination may be different than the methods and/or circuitry used with respect to the high-side adjustable delay. The low-side delay guidance circuit 456 performs this determination during a time period that occurs after the high-side FET 106 has turned off and before the low-side FET 110 has turned on. The adjusted low-side adjustable delay value based on this determination is used during a subsequent switching cycle. A guidance signal output node of the low-side delay guidance circuit 456 is communicatively coupled to the low-side adjustable delay circuit 452. The low-side delay guidance circuit 456 has a sense input node that is electrically coupled to the phase node 114 (to receive the signal PH) and a latch input node that is communicatively coupled to the low-side gate drive node 458 (to receive the signal $L_{ON}$). The guidance signal output node of the low-side delay guidance circuit 456 is communicatively coupled to the low-side adjustable delay circuit 452. The low-side delay guidance circuit 456 uses signals received at the sense input node from the phase node 114 (signal PH) and signals received at the latch input from the low-side gate drive node 458 (signal $L_{ON}$) to detect, and latch the results of, body-diode conduction of the low-side FET 110. Based on the presence or absence of detected body-diode conduction, the low-side delay guidance circuit 456 generates a low-side delay adjustment guidance signal, which is designated as LS Delay Incr./Decr. As will be discussed with reference to FIGS. 7A, 7B, and 9, the high-side delay guidance circuit 442 and the low-side delay guidance circuit 456 detect body-diode conduction of the low-side FET 110 using sense parameters which may differ with regards to adjusting the high-side adjustable delay and the low-side adjustable delay. For example, the delay guidance circuits 442, 456 may use different threshold voltages, use threshold voltages having different absolute values, use different circuit topologies, and/or may perform measurements at different times and/or based on different system states.

Example embodiments of the adjustable delay circuits 438, 452 are described below with reference to FIGS. 11A-B, and FIGS. 12A-B. In some embodiments, the adjustable delays provided by the adjustable delay circuits 438, 452 are set to be shorter than the fixed delays provided by the fixed delay circuits 440, 454. This allows for the possibility of cross-conduction, but also allows the converter 100 to find an absolute optimum operating point. If the power stage of the converter 100 is well defined, the fixed delays can be set such that the absolute minimum adjustable delays produce a zero or almost zero anti-cross-conduction interval.

Figure 5:
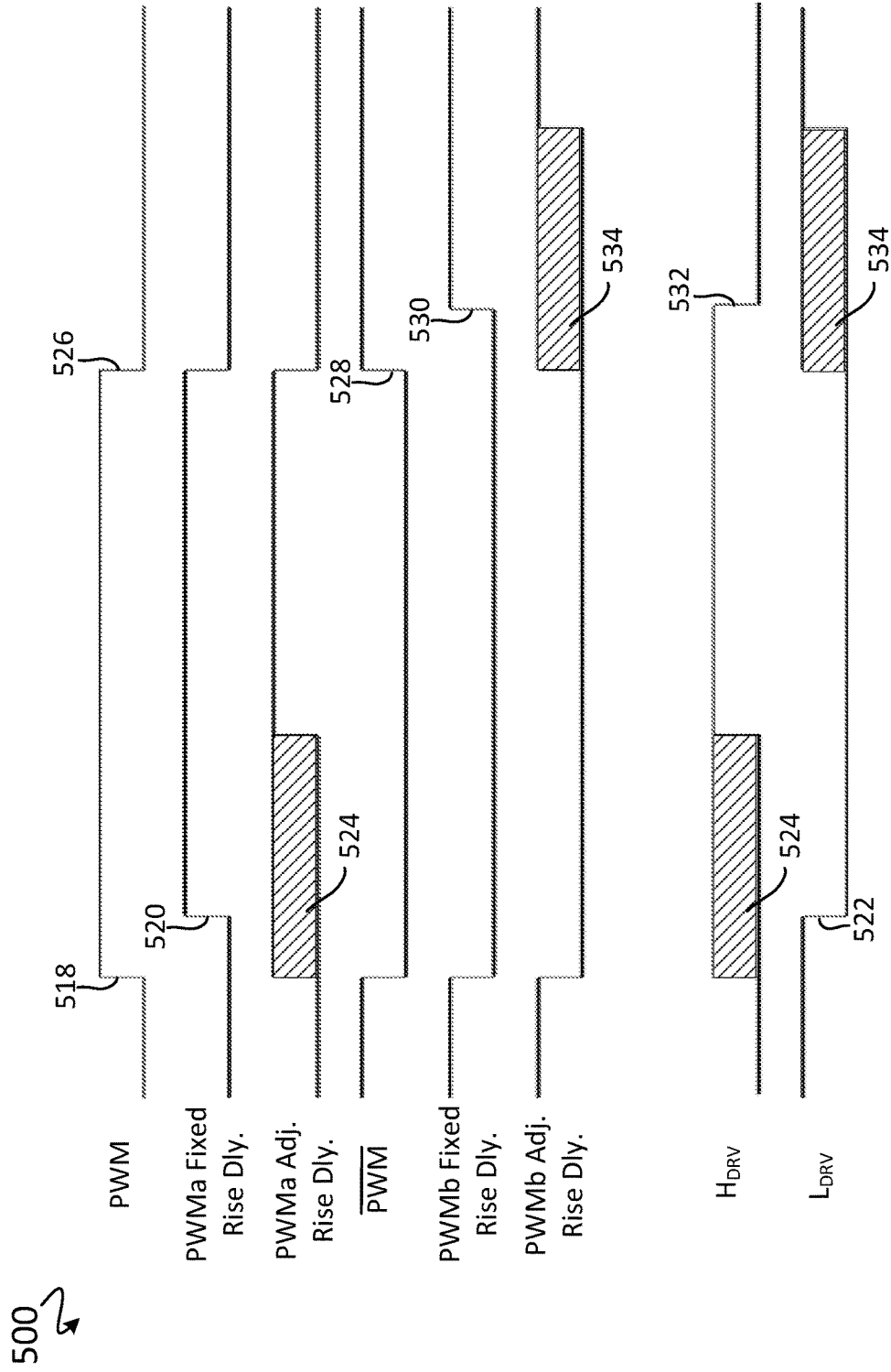
FIG. 5 is a simplified signal timing diagram.

FIG. 5 shows a simplified signal diagram 500 which is discussed with reference to FIG. 4. Only purposely added delays are shown. Short gate delays are ignored or treated as zero for simplicity but may be present. At an initial state, the low-side FET 110 is on ($L_{DRV}$ is asserted) and the high-side FET 106 is off ($H_{DRV}$ is de-asserted). A rising edge 518 of the PWM signal signals the low-side FET 110 to turn off and the high-side FET 106 to turn on. To turn the low-side FET 110 off, the low-side fixed delay circuit 454 receives the PWM signal and delays the rising transition edge 518 of the PWM signal by a low-side fixed delay to produce the delayed rising transition edge 520 of PWMa Fixed Rise Dly. The rising transition edge 520 of PWMa Fixed Rise Dly. produces a corresponding falling transition edge 522 of $L_{DRV}$ (as the low-side drive latch circuit 460 is reset). To turn the high-side FET 106 on, the high-side adjustable delay circuit 438 receives the PWM signal and delays the rising transition edge 518 of the PWM signal by a high-side adjustable delay amount 524. The resultant delayed signal is designated as PWMa Adj. Rise Dly. As was described with reference to FIG. 4, the rising transition edge of PWMa Adj. Rise Dly. produces a corresponding rising transition edge of $H_{DRV}$ (as the high-side drive latch circuit 446 is set).

At a later time, a falling edge 526 of the PWM signal signals the high-side FET 106 to turn off and the low-side FET 110 to turn on. To turn the high-side FET 106 off, the high-side fixed delay circuit 440 receives the $\overline{PWM}$ signal and delays a rising transition edge 528 of the $\overline{PWM}$ signal by a high-side fixed delay to produce the delayed rising transition edge 530 of PWMb Fixed. Rise Dly. The rising transition edge 530 of PWMb Fixed Rise Dly. produces a corresponding falling transition edge 532 of $H_{DRV}$ (as the high-side drive latch circuit 446 is reset). To turn the low-side FET 110 on, the low-side adjustable delay circuit 452 receives the $\overline{PWM}$ signal and delays the rising transition edge 528 of the $\overline{PWM}$ signal by a low-side adjustable delay amount 534. The resultant delayed signal is designated as PWMb Adj. Rise Dly. As was described with reference to FIG. 4, the rising transition edge of PWMb Adj. Rise Dly. produces a corresponding rising transition edge of $L_{DRV}$ (as the low-side drive latch circuit 460 is set). As shown in FIG. 5, only rising transition edges of the PWM and $\overline{PWM}$ signals are delayed by the adjustable delay circuits 438, 452 and the fixed delay circuits 440, 454. This advantageously simplifies circuit design and layout. The delay circuits can be of any suitable topology, but should only delay a rising signal transition edge. Falling signal transition edges should not be delayed by the delay circuit (beyond normal propagation time).

Figure 6A:
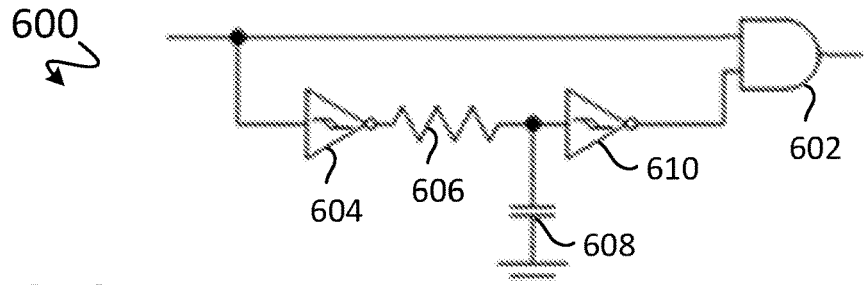
FIG. 6A is a simplified schematic of an example delay circuit, in accordance with some embodiments.

FIG. 6A shows a simplified schematic of an example fixed delay circuit 600 that only delays a rising transition edge of a signal received by the fixed delay circuit 600. In some embodiments, either or both of the fixed delay circuits 440, 454 are similar to the fixed delay circuit 600. However, other delay circuits as are known in the art that are suitable for providing a fixed delay are contemplated. The fixed delay circuit 600 generally includes an AND gate 602 having a first input coupled to an input node of the fixed delay circuit 600. An inverting Schmitt trigger 604 has an input coupled to the input node of the fixed delay circuit 600 and an output coupled to a resistor 606. The resistor 606 is coupled to a ground node through a capacitor 608 and to an input of an inverting Schmitt trigger 610. An output of the inverting Schmitt trigger 610 is coupled to a second input of the AND gate 602. The Schmitt triggers 604, 610, the resistor 606, and the capacitor 608 produce a delayed version of a signal received at the input node of the fixed delay circuit 600. By ANDing the received signal with a delayed version of the received signal, only the rising transition edge of the received signal is delayed at the output of the fixed delay circuit 600. The amount of fixed delay corresponds to an RC time constant of the RC circuit formed by the resistor 606 and the capacitor 608. Some elements of the fixed delay circuit 600, though understood by one of ordinary skill in the art to be present, have been omitted from the simplified circuit schematic for simplicity.

Figure 6B:
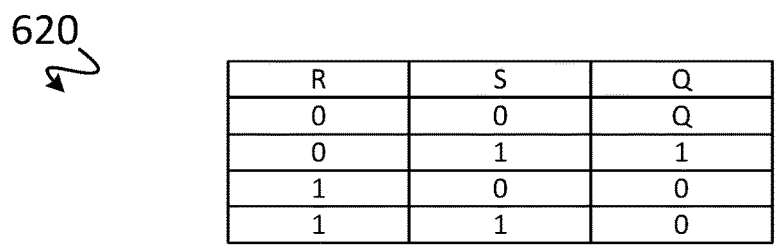
FIG. 6B is an example state table of a reset dominant latch circuit, in accordance with some embodiments.

Returning attention to FIG. 4, drive latch circuits 446, 460 each respectively latches a positive transition signal received at respective inputs S at their respective outputs Q. In some embodiments, the drive latch circuits 446, 460 are rising edge triggered. Though receiving a transition at S and R simultaneously at either of the drive latch circuits 446, 460 is unlikely, if it were to occur, the safest course of action is 'to reset that drive latch circuit, thereby turning the FET coupled to that drive latch circuit off. Thus, the drive latch circuits 446, 460 are advantageously implemented in some embodiments as reset dominant latches. However, other latches known in the art suitable for latching signals as described are contemplated. A state table 620 of a reset dominant latch similar to the drive latch circuits 446, 460 is shown in FIG. 6B. As shown in the final row of the state table 620, if a rising edge of a signal is received at an input R of a reset dominant latch at the same time that a rising edge of a signal is received at an input S of that latch, a de-asserted value is latched at the output Q of that latch.

Figure 6C:
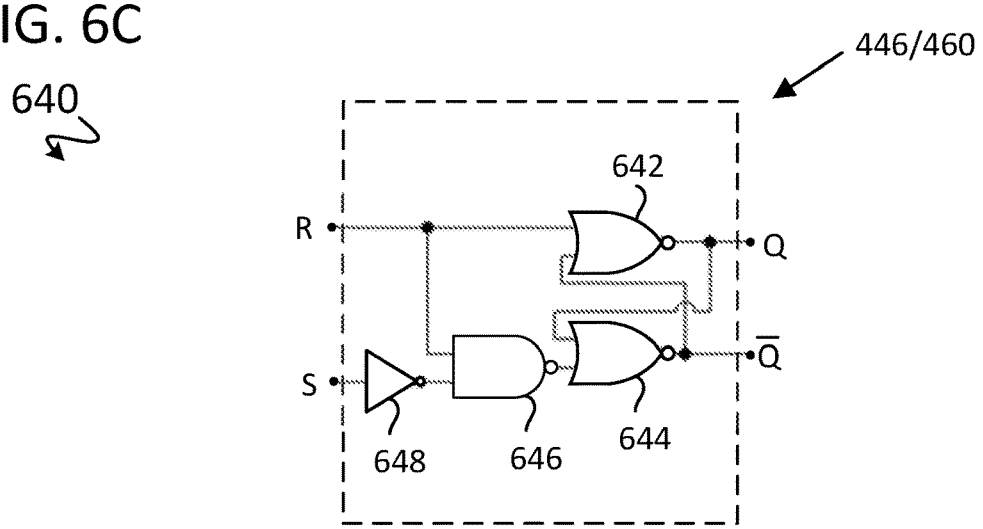
FIG. 6C is a simplified schematic of an example reset dominant latch circuit, in accordance with some embodiments.
Figure 6D:
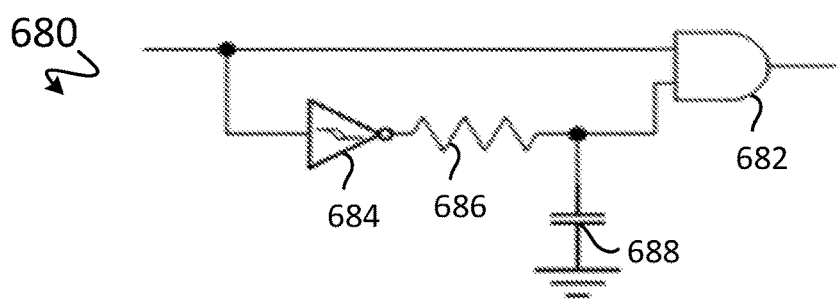
FIG. 6D is a simplified schematic of an example positive signal edge detector circuit, in accordance with some embodiments.

A simplified schematic of an example reset dominant, rising edge triggered latch ("latch") circuit 640 is shown in FIG. 6C. In some embodiments, either or both of the drive latch circuits 446, 460 are similar to the latch circuit 640. However, other latch circuits known in the art that are suitable for latching a signal as described are contemplated. The reset dominant latch circuit 640 generally includes cross-connected NOR gates 642, 644 coupled to an inverter 648 and a NAND gate 646. In some embodiments, R and S inputs of the latch circuit 640 are each coupled to a respective positive edge detection circuit. A simplified schematic of an example positive edge detection circuit 680 is shown in FIG. 6D. As shown, the positive edge detection circuit 680 generally includes an AND gate 682, an inverting Schmitt trigger 684, a resistor 686, and a capacitor 688. The AND gate 682 has a first input coupled to an input node of the positive edge detection circuit 680. The inverting Schmitt trigger 684 has an input coupled to the input node of the positive edge detection circuit 680 and an output coupled to the resistor 686. The resistor 686 is coupled to a ground node through the capacitor 688 and to a second input of the AND gate 682. A rising edge of a signal received at the input of the positive edge detection circuit 680 will produce an output pulse at the output of the AND gate 682. The width of the output pulse corresponds to an RC time constant of the RC circuit formed by the resistor 686 and the capacitor 688. In some embodiments, the resistor 686 and the capacitor 688 are chosen such that the output pulse is sufficiently narrow as to guarantee latch operation of the cross-connected NOR gate portion of the latch circuit 640. Some elements of the positive edge detection circuit 680, though understood by one of ordinary skill in the art to be present, have been omitted from the simplified circuit schematic for simplicity.

As was discussed with reference to FIGS. 2A-B and FIG. 4, detecting the presence or absence of body-diode conduction of the low-side FET 110 as determined by the delay guidance circuits 442, 456 is used to increase or decrease respective adjustable delays applied by the adjustable delay circuits 438, 452. In some embodiments, body-diode conduction of the low-side FET 110 is determined by the delay guidance circuits 442, 456 using different circuitry, threshold voltages, and/or methodologies. In some embodiments, body-diode conduction of the low-side FET 110 is detected and latched with a D flip-flop that is clocked when respective $H_{ON}/L_{ON}$ signals are asserted. This latches the state of a comparator output. In some embodiments, the latched comparator output represents a latched comparison of a voltage at the phase node 114 (e.g., the signal PH) to a threshold voltage. If the voltage at the phase node 114 is lower than this threshold voltage, body-diode conduction of the low-side FET 110 has begun. An output value of the comparator is latched and received by the respective adjustable delay circuit 438/452. Based on the received value, the respective adjustable delay circuit 438/452 will decrease its adjustable delay value upon receiving a subsequent transition signal. If the voltage at the phase node 114 is not lower than the respective threshold voltage, body-diode conduction of the low-side FET 110 has not begun. Thus, a corresponding output value of the comparator is latched and received by the respective adjustable delay circuit 438/452. Based on the received value, the respective adjustable delay circuit 438/452 will increase its adjustable delay value upon receiving a subsequent transition signal.

Figure 7A:
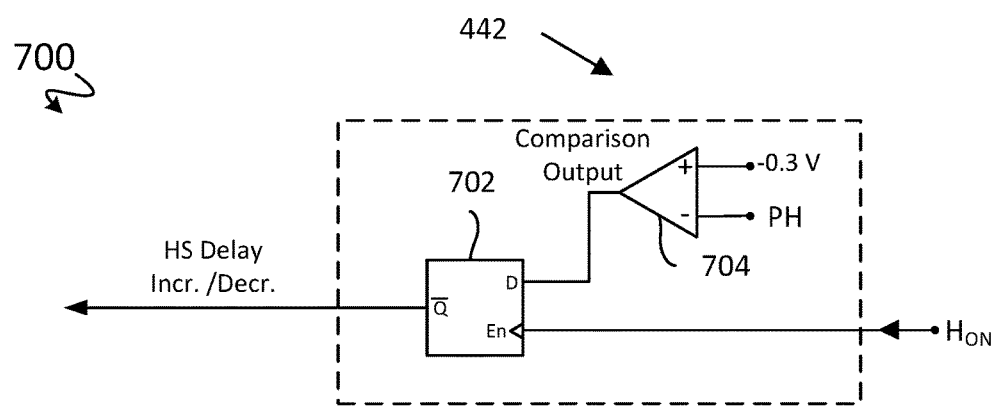
FIGS. 7A-B are simplified schematics of example delay guidance circuits, in accordance with some embodiments.
Figure 7B:
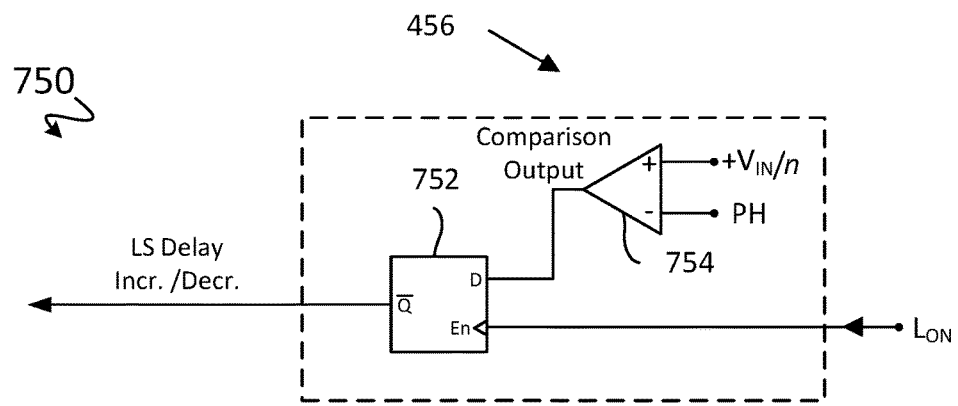

In some embodiments, the high-side delay guidance circuit 442 is similar to a high-side delay guidance circuit 700 shown in the simplified circuit schematic of FIG. 7A and the low-side delay guidance circuit 456 is similar to a low-side delay guidance circuit 750 shown in the simplified circuit schematic of FIG. 7B. Some elements of the delay guidance circuits 700, 750, though understood by one of ordinary skill in the art to be present, have been omitted from the simplified circuit schematics for simplicity.

The high-side delay guidance circuit 700 generally includes a D flip-flop 702 and a voltage comparison circuit 704 (e.g., a comparator). A non-inverting input of the voltage comparison circuit 704 is electrically coupled to a first reference voltage. In some embodiments, the first reference voltage is a value that is between zero volts and a diode-drop (e.g., 0.7 volts) below zero volts. In the example shown, the first reference voltage is −0.3 volts. An inverting input of the voltage comparison circuit 704 is electrically coupled to the phase node 114 to receive the signal PH (e.g., through the sense input node of the high-side delay guidance circuit 442). An output of the voltage comparison circuit 704 is coupled to an input ("D") of the D flip-flop 702. In the example shown, a rising transition edge of the signal $H_{ON}$ from the high-side gate drive node 444 is received at an enable input ("En") of the D flip-flop 702 (e.g., through the latch input node of the high-side delay guidance circuit 442). Whatever value is present at input D when the positive transition edge of the signal $H_{ON}$ is received at En is latched on an output of the D flip-flop 702. Thus, a determination of body-diode conduction of the low-side FET 110 occurring during a time period before the high-side FET 106 is turned on is latched. In some embodiments, an inverted output $\overline{Q}$ is used as the latched output of the D flip-flop 702 for the high-side delay adjustment guidance signal HS Delay Incr./Decr. However, in some embodiments, this logic may be inverted. The high-side delay adjustment guidance signal HS Delay Incr./Decr. is received by the high-side adjustable delay circuit 438. The received high-side delay adjustment guidance signal HS Delay Incr./Decr. configures the high-side adjustable delay circuit 438 to increase or decrease the amount of high-side adjustable delay applied to rising transition edges received by the high-side adjustable delay circuit 438 during a subsequent switching cycle. In some embodiments, the high-side adjustable delay is increased or decreased by the high-side adjustable delay circuit 438 upon receiving the next transition of the PWM or $\overline{PWM}$ signal. In some embodiments, if HS Delay Incr./Decr. is asserted, the high-side adjustable delay is increased by the high-side adjustable delay circuit 438 and if HS Delay Incr./Decr. is de-asserted, the high-side adjustable delay is decreased by the high-side adjustable delay circuit 438. However, in some embodiments, this logic may be inverted.

The low-side delay guidance circuit 750 generally includes a D flip-flop 752 and a voltage comparison circuit 754 (e.g., a comparator). A non-inverting input of the voltage comparison circuit 754 is electrically coupled to a second reference voltage, the second reference voltage being a different reference voltage than the first reference voltage used by the high-side delay guidance circuit 700. Additionally, in some embodiments, the absolute value of the second reference voltage is different than the absolute value of the first reference voltage. For example, in some embodiments, the second reference voltage is a value that is fractionally proportional to the input voltage $V_{IN}$, expressed as $V_{IN}$ divided by a value n. An inverting input of the voltage comparison circuit 754 is electrically coupled to the phase node 114 (e.g., through the sense input node of the low-side delay guidance circuit 456) to receive the signal PH from the phase node 114. An output of the voltage comparison circuit 754 is coupled to an input ("D") of the D flip-flop 752. In the example shown, a positive transition edge of the signal $L_{ON}$ from the low-side gate drive node 458 is received at an enable input ("En") of the D flip-flop 752 (e.g., through the latch input node of the low-side delay guidance circuit 456). Whatever value is present at input D when the rising transition edge of the signal $L_{ON}$ is received at En is latched on an output of the D flip-flop 752. Thus, a determination of body-diode conduction of the low-side FET 110 occurring during a time period before the low-side FET 110 is turned on is latched. In some embodiments, an inverted output $\overline{Q}$ is used as the latched output of the D flip-flop 752 for the low-side delay adjustment guidance signal LS Delay Incr./Decr. However, in some embodiments, this logic may be inverted. The low-side delay adjustment guidance signal LS Delay Incr./Decr. is received by the low-side adjustable delay circuit 452. The received low-side delay adjustment guidance signal LS Delay Incr./Decr. configures the low-side adjustable delay circuit 452 to increase or decrease the amount of low-side adjustable delay applied to rising transition edges received by the low-side adjustable delay circuit 452. In some embodiments, the low-side adjustable delay is increased or decreased when a transition edge of a signal is received at the low-side adjustable delay circuit 452. In some embodiments, the low-side adjustable delay is increased or decreased by the low-side adjustable delay circuit 452 upon receiving a transition of the PWM or $\overline{PWM}$ signal. In some embodiments, if LS Delay Incr./Decr. is asserted, the low-side adjustable delay is increased by the low-side adjustable delay circuit 452 and if LS Delay Incr./Decr. is de-asserted, the low-side adjustable delay is decreased by the low-side adjustable delay circuit 452. However, in some embodiments, this logic may be inverted.

FIGS. 8A-B are simplified signal diagrams 800, 850 that illustrate a latched sampling point of a voltage at the phase node 114, the sampling point being latched by a circuit similar to the high-side delay guidance circuit 700. The latched sampling point is indicated by a vertical dashed line. As was described with reference to FIG. 7A, when a rising transition edge is received at the enable input En of the D flip-flop 702 of the high-side delay guidance circuit 700, an inverted output of the voltage comparison circuit 704 is latched at the inverted output $\overline{Q}$ of the D flip-flop 702. As shown in FIG. 8A, a rising transition edge of signal $H_{ON}$ causes a voltage comparison value to be sampled at a point in time when the voltage at the phase node 114 (the signal PH) is below a threshold voltage "Threshold V." In the example shown Threshold V corresponds to a reference voltage at the non-inverting input of the voltage comparison circuit 704. As such, the voltage comparison circuit 704 outputs an asserted value (which is inverted) and the high-side adjustable delay circuit 438 decreases the adjustable delay associated with that adjustable delay circuit.

FIG. 8B shows the same signals as FIG. 8A, however the adjustable time delay of the high-side adjustable delay circuit 438 is short enough that the body-diode conduction of the low-side FET 110 was acceptably short. However, even with optimal timing, some body-diode conduction of the low-side FET 110 can occur because of propagation delays, overdrive requirements, and/or other non-idealities.

Figure 9:
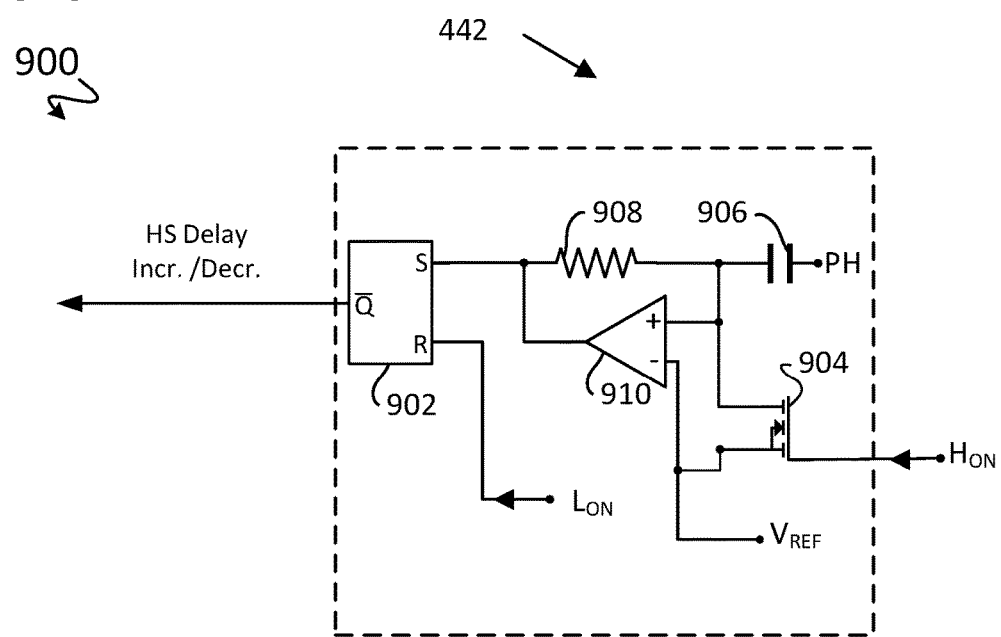
FIG. 9 is a simplified schematic of an example delay guidance circuit, in accordance with some embodiments.

In some embodiments one or both of the delay guidance circuits 700, 750 detects body-diode conduction of the low-side FET 110 using a phase differentiator circuit. Accordingly, another embodiment of a high-side delay guidance circuit 900 is shown in FIG. 9. In some embodiments, the high-side delay guidance circuit 442 of FIG. 4 is similar to the high-side delay guidance circuit 900. Rather than producing a delay adjustment guidance signal (e.g. HS Delay Incr./Decr.) that is strictly based on comparing a voltage at the phase node 114 to a reference voltage, the high-side delay guidance circuit 900 outputs a signal in accordance with a rate of change (e.g. a slope) of the voltage at the phase node 114 immediately following turn off of the low-side FET 110. Thus, the high-side delay guidance circuit 900 embodies a phase differentiator circuit. During the switching interval after the voltage at the phase node 114 has fallen to a negative voltage level, any negative slope of the voltage at the phase node 114 indicates that the body-diode of the low-side FET 110 is about to begin body-diode conduction. If this condition is detected, it is advantageous to turn the high-side FET 106 on sooner after the low-side FET 110 is turned off. Accordingly, the high-side adjustable delay is decreased.

The high-side delay guidance circuit 900 generally includes a reset dominant SR latch circuit 902, a FET 904, a capacitor 906, a resistor 908, and a voltage comparison circuit 910 coupled as shown in FIG. 9. A gate node of the FET 904 receives the signal $H_{ON}$ from the high-side gate drive node 444 and a reset input ("R") of the SR latch circuit 902 receives the signal $L_{ON}$ from the low-side gate drive node 458 (e.g., through latch input nodes of the high-side delay guidance circuit 442). Accordingly, previously latched results are reset by a rising transition edge of $L_{ON}$. A first terminal of the capacitor 906 is electrically coupled to the phase node 114 to receive the signal PH (e.g., through the sense input node of the high-side delay guidance circuit 442) and a second terminal of the capacitor 906 is coupled to a non-inverting input of the voltage comparison circuit 910. The signal PH is a changing voltage at the phase node 114. An inverting input of the voltage comparison circuit 910 is coupled to a reference voltage $V_{REF}$. In some embodiments, this reference voltage is a ground voltage. An output of the voltage comparison circuit 910 is coupled to a set input ("S") of the SR latch circuit 902. An input signal level at the set input S is latched at an inverting output ("$\overline{Q}$") of the SR latch circuit 902 until the reset input R of the SR latch circuit 902 is asserted. Accordingly, when a signal at the phase node 114 has a negative slope, a de-asserted value of the high-side delay adjustment guidance signal HS Delay Incr./Decr. is latched at the inverting output $\overline{Q}$. When a signal at the phase node 114 has a positive slope, an asserted value of HS Delay Incr./Decr. is latched at the inverting output $\overline{Q}$. In some embodiments, if HS Delay Incr./Decr. is asserted, the high-side adjustable delay is increased by the high-side adjustable delay circuit 438 and if HS Delay Incr./Decr. is de-asserted, the high-side adjustable delay is decreased by the high-side adjustable delay circuit 438.

Figure 10A:
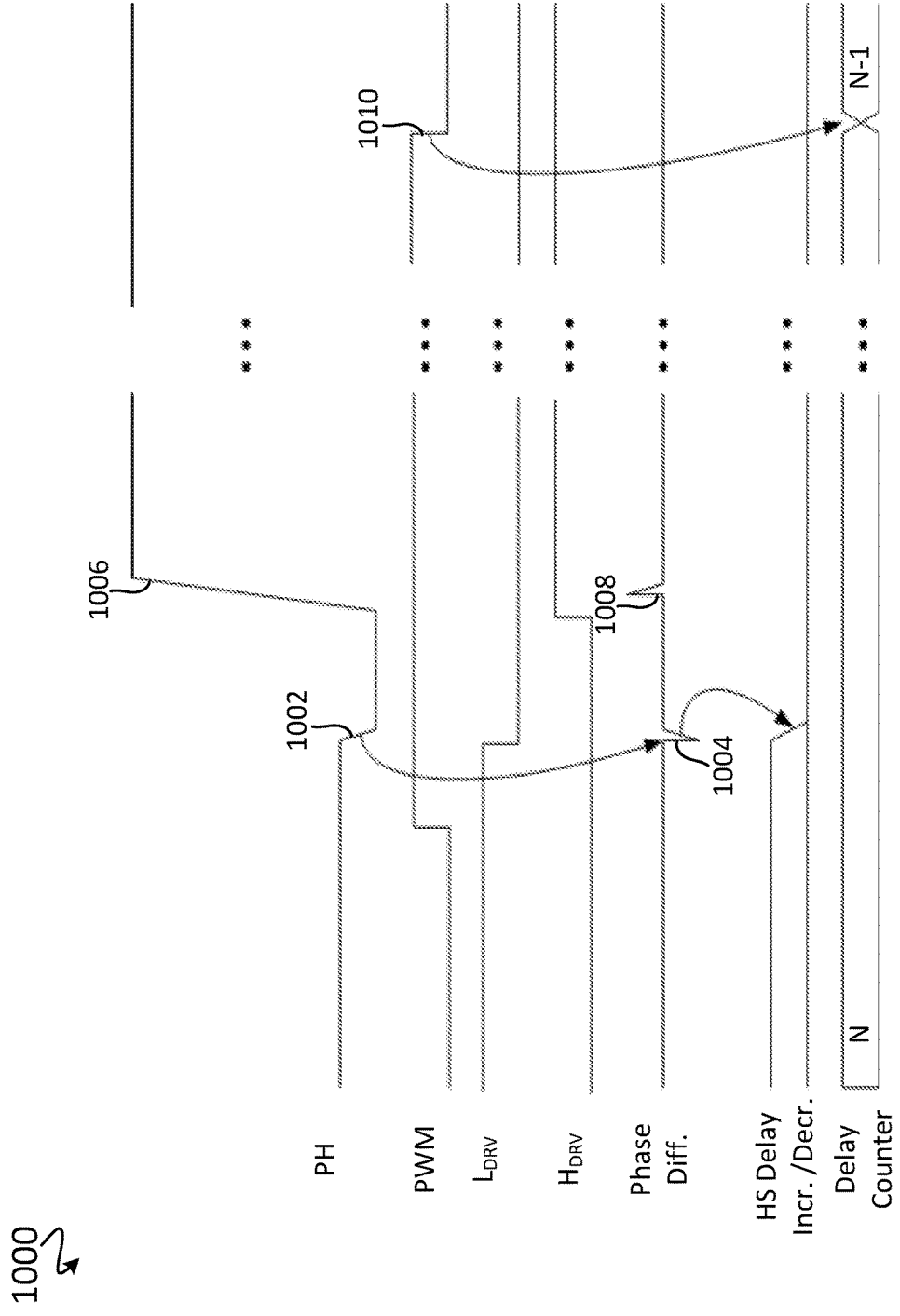

A simplified signal diagram 1000 shown in FIG. 10A illustrates signals at various nodes of the converter 100 in an embodiment where the high-side delay guidance circuit 442 is similar to the high-side delay guidance circuit 900. In the example shown, body-diode conduction of the low-side FET 110 occurs after the low-side FET 110 has turned off and before the high-side FET 106 has turned on. The low-side FET 110 is transitioned to an OFF state by the de-assertion of the signal $L_{DRV}$. The high-side FET is transitioned to an ON state by the assertion of the signal $H_{DRV}$. As shown, a negative voltage slope 1002 of the phase signal PH at the phase node 114 (e.g. a voltage at the phase node 114) produces a negative pulse 1004 of a phase differentiator circuit (e.g., all or a portion of the high-side delay guidance circuit 900), indicating the beginning of body-diode conduction of the low-side FET 110. Thus, a de-asserted value is latched by the high-side delay guidance circuit 900 which produces a de-asserted HS Delay Incr./Decr. signal. The de-asserted HS Delay Incr./Decr. signal is received by the high-side adjustable delay circuit 438. Accordingly, the high-side adjustable delay circuit 438 is configured to decrease the high-side adjustable delay (e.g., by adjusting a delay counter) on a subsequent transition edge of a high-side clock signal. In the example shown, the subsequent transition edge of the high-side clock signal is a falling edge 1010 of the PWM signal. As shown, a positive voltage slope 1006 of the phase signal PH at the phase node 114 produces a positive pulse 1008 from the phase differentiator circuit. However, the high-side delay guidance circuit 900 is configured to ignore these positive pulses.

Figure 10B:
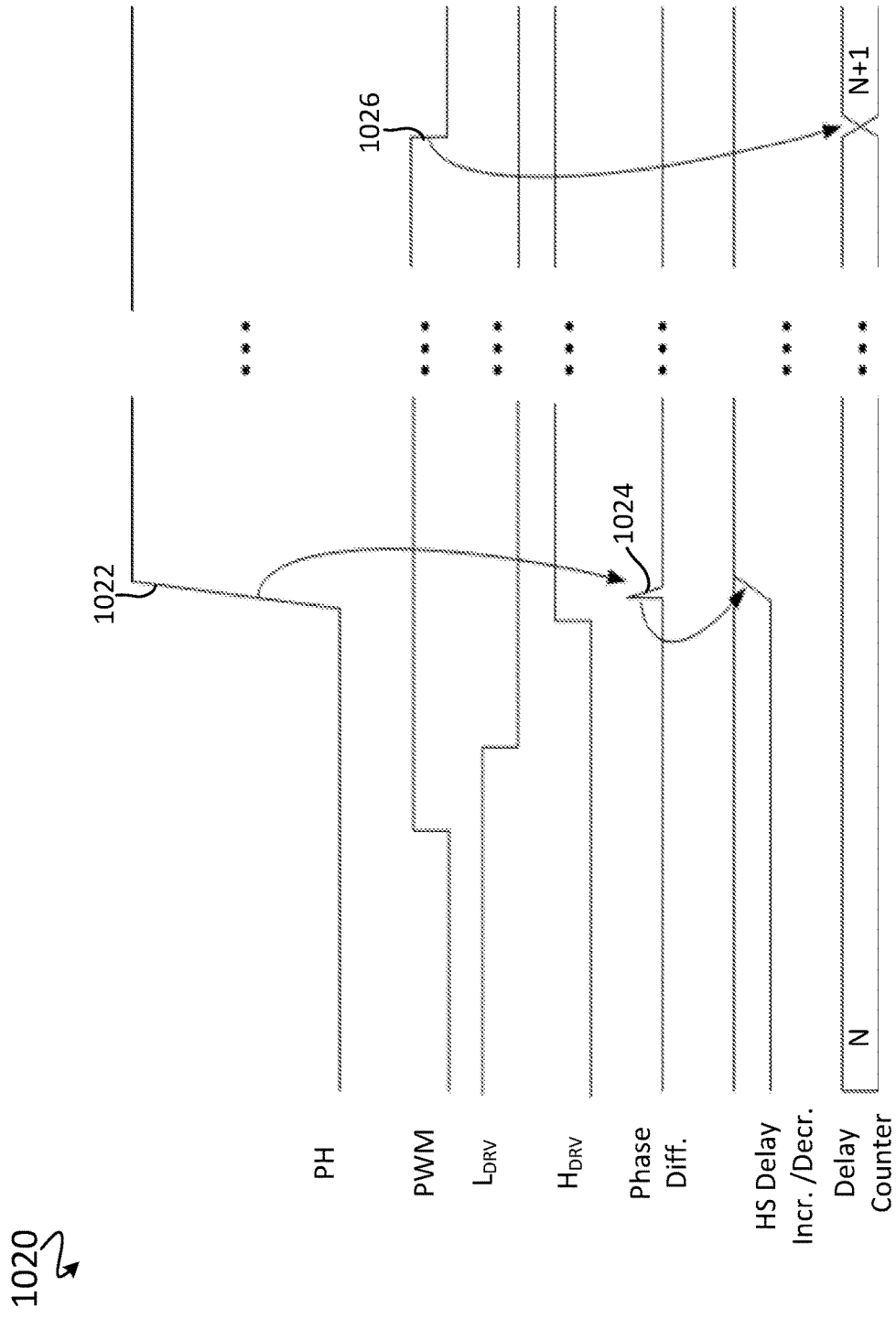

A simplified signal diagram 1020 shown in FIG. 10B illustrates signals at various nodes of the converter 100 in an embodiment where the high-side delay guidance circuit 442 is similar to the high-side delay guidance circuit 900. In the example shown, body-diode conduction of the low-side FET 110 does not occur after the low-side FET 110 has turned off and before the high-side FET 106 has turned on. As shown, a positive voltage slope 1022 of the phase signal PH at the phase node 114 produces a positive pulse 1024 from the phase differentiator circuit. This indicates that body-diode conduction of the low-side FET 110 has not begun. Thus, the high-side delay guidance circuit 900 produces an asserted HS Delay Incr./Decr. signal. The asserted HS Delay Incr./Decr. signal is received by the high-side adjustable delay circuit 438. Accordingly, the high-side adjustable delay circuit 438 is configured to increase the high-side adjustable delay (e.g., by adjusting a delay counter) on a subsequent transition edge of a high-side clock signal. In the example shown, the subsequent transition edge of the high-side clock signal is a falling edge 1026 of the PWM signal.

Figure 10C:
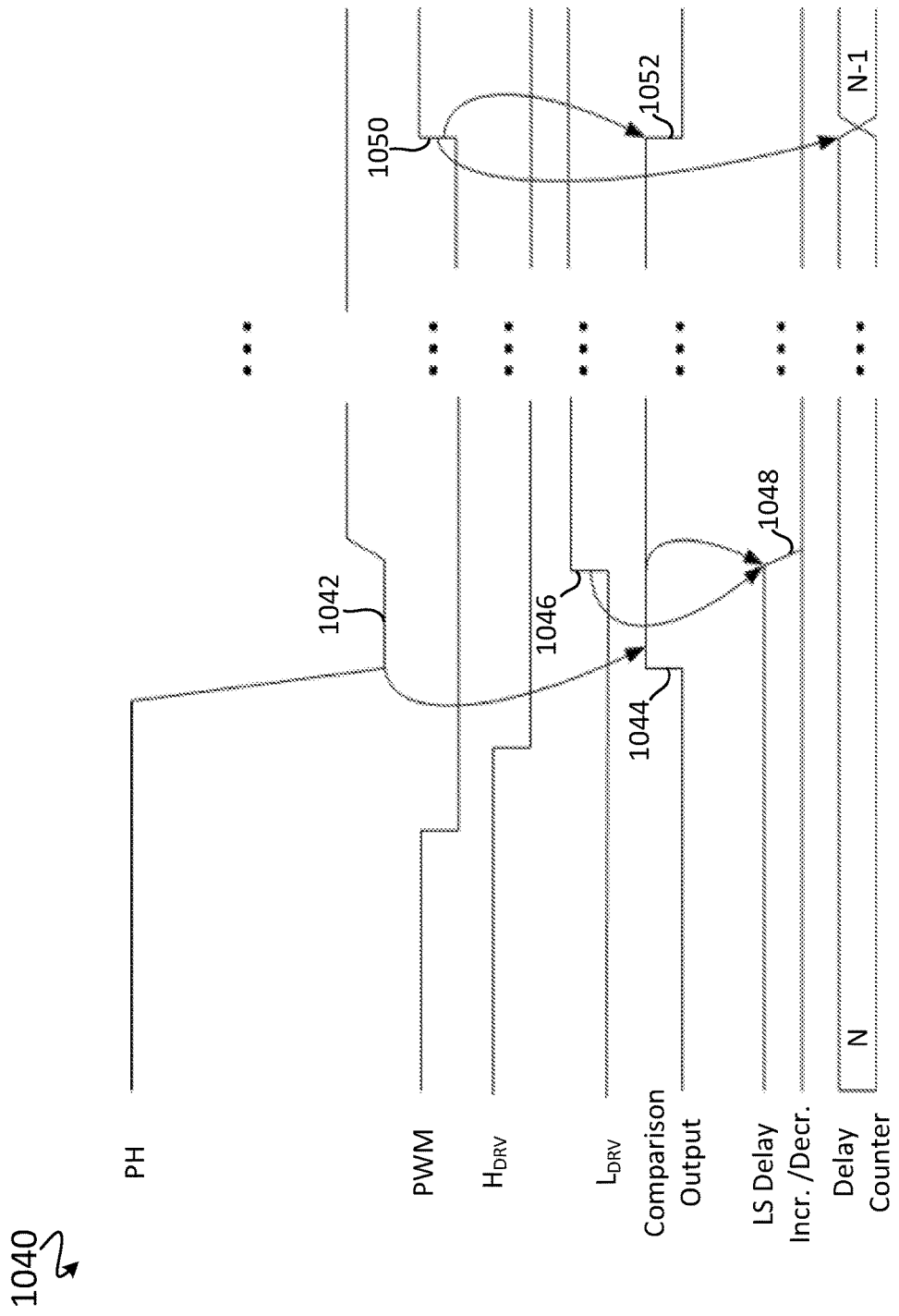

A simplified signal diagram 1040 shown in FIG. 10C illustrates signals at various nodes of the converter 100 in an embodiment where the low-side delay guidance circuit 456 is similar to the low-side delay guidance circuit 750 of FIG. 7B. In the example shown, body-diode conduction of the low-side FET 110 occurs after the high-side FET 106 has turned off and before the low-side FET 110 has turned on. When the high-side FET 106 has turned off, inductor current begins to pull the phase node 114 toward GND. Eventually, a voltage at the phase node 114 will fall below GND as current transitions from the high-side FET 106 to the low-side FET 110. This is illustrated as a voltage level 1042 of signal PH at the phase node 114 which is less than a threshold voltage (e.g., $V_{IN}/n$, −0.3 v, 0 v, or another threshold voltage). Thus, a voltage comparison circuit similar to the voltage comparison circuit 754 produces an asserted comparison output at 1044. At some time later, a rising transition edge 1046 of $L_{DRV}$ is caused by an assertion of signal $L_{ON}$ (not shown), which latches an inverted output at the output of the low-side delay guidance circuit producing a de-asserted value of LS Delay Incr./Decr. at 1048. The de-asserted LS Delay Incr./Decr. signal is received by the low-side adjustable delay circuit 452. Accordingly, the low-side adjustable delay circuit 452 is configured to decrease the low-side adjustable delay on a subsequent transition edge of a low-side clock signal. In the example shown, the subsequent transition edge of the low-side clock signal is a rising transition edge 1050 of the PWM signal. The rising transition edge 1050 of the PWM signal also resets the previously latched value of the comparison output at 1052.

A simplified signal diagram 1060 shown in FIG. 10D illustrates signals at various nodes of the converter 100 in an embodiment where the low-side delay guidance circuit 456 is similar to the low-side delay guidance circuit 750 of FIG. 7B. In the example shown, body-diode conduction of the low-side FET 110 does not occur after the high-side FET 106 has turned off and before the low-side FET 110 has turned on. A voltage level 1062 of signal PH at the phase node 114 is greater than a threshold voltage (e.g., $V_{IN}/n$, −0.3 v, or another threshold voltage). Thus, a voltage comparison circuit similar to the voltage comparison circuit 754 produces a de-asserted comparison output at 1064. At some time later, a rising transition edge 1066 of $L_{DRV}$ is caused by an assertion of signal $L_{ON}$ (not shown) which latches an inverted output at the output of the low-side delay guidance circuit 750, producing an asserted value of LS Delay Incr./Decr. at 1068. The asserted LS Delay Incr./Decr. signal is received by the low-side adjustable delay circuit 452. Accordingly, the low-side adjustable delay circuit 452 is configured to increase the low-side adjustable delay on a subsequent transition edge of a low-side clock signal. In the example shown, the subsequent transition edge of the low-side clock signal is a rising transition edge 1070 of the PWM signal.

Figure 11A:
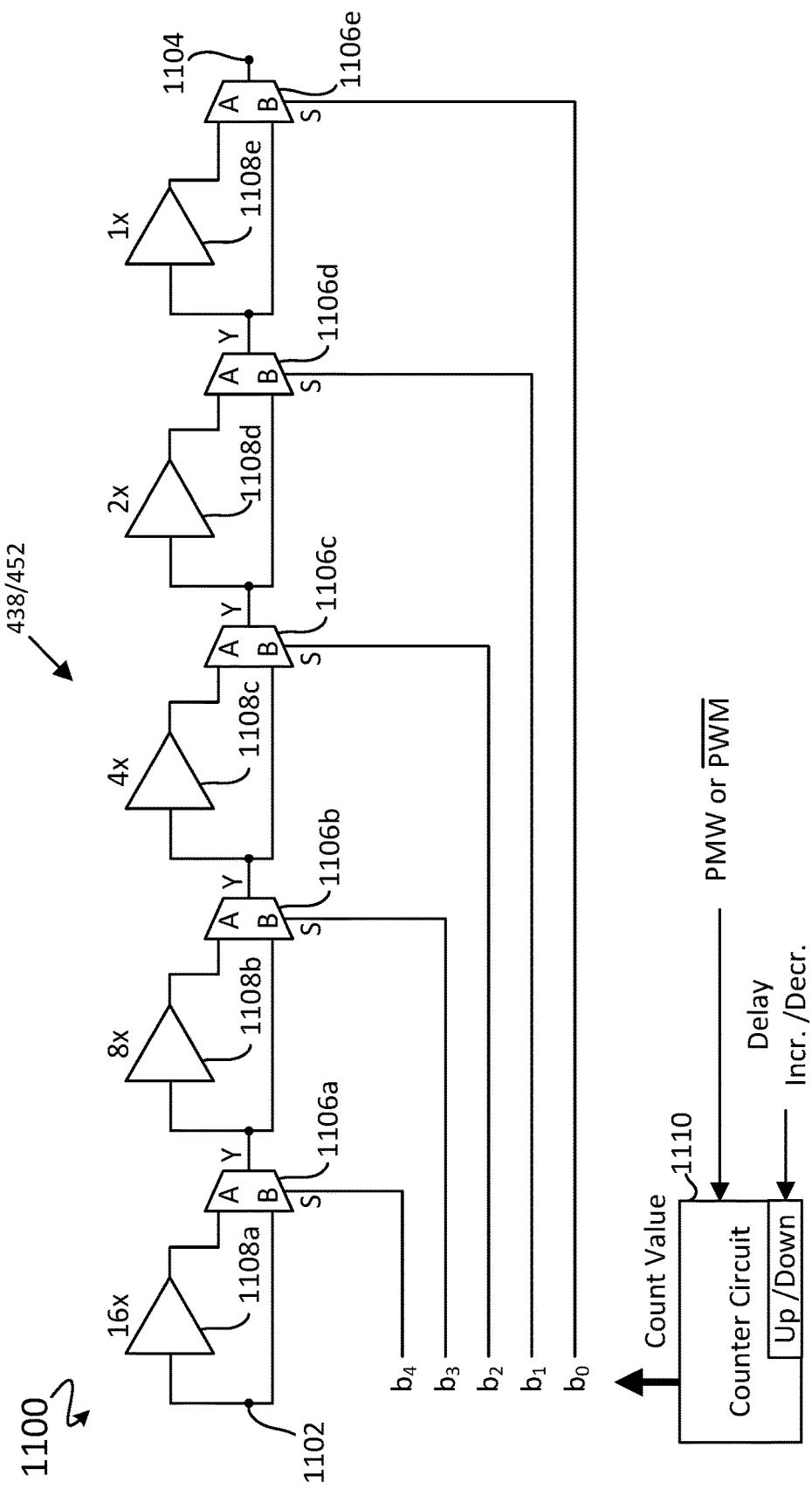
FIG. 11A is a simplified schematic of an example adjustable delay circuit, in accordance with some embodiments.

FIG. 11A is a simplified schematic of an example adjustable delay circuit 1100 of one or both of the adjustable delay circuits 438/452, in accordance with some embodiments. The adjustable delay circuit 1100 generally includes a signal input node 1102, a signal output node 1104, signal muxing circuits 1106a-e, delay circuits 1108a-e, a digital counter circuit 1110 having a count Up/Down configuration input, and delay select nodes $b_{0-4}$. In some embodiments, one or more of the delay circuits 1108a-e are similar to the fixed delay circuit 600. However, other delay circuits as are known in the art that are suitable for delaying a signal as described are contemplated. A signal (e.g., PWM or $\overline{PWM}$) is received at a signal input node 1102 and a signal having a delayed rising transition edge (e.g., PWMa Adj. Rise Dly. or PWMb Adj. Rise Dly.) is output from the signal output node 1104. The digital counter circuit 1110 is configured to count up or down based on a Delay Incr./Decr. signal received at input "Up/Down" from a respective one of the delay guidance circuits 442, 456. Upon receiving an input at input "Up/Down," further changes in the state of count direction are locked out until the counter is clocked or the lock-out is reset by some other appropriate outside signal. Upon receiving a signal transition of a gate drive signal (e.g., PWM or $\overline{PWM}$), the digital counter circuit 1110 either increments or decrements a delay counter. The count value of the delay counter is transmitted to the delay select nodes $b_{0-4}$. Based on the asserted or de-asserted values at respective signal selection ("S") inputs, the signal muxing circuits 1106a-e either propagate an additionally delayed signal received at input A (e.g., a delayed signal input) to signal output Y or propagate a signal received at input B (e.g., a direct signal input) to signal output Y. As such, the signal muxing circuits 1106a-e are controlled by the selection of inputs $b_{0-4}$ to adjust the amount of delay applied to a rising transition edge of the received signal using delay circuits 1108a-e. In some embodiments, the digital counter circuit 1110 is implemented as an up/down counter having a preset (assuming all 1's represents a maximum delay of the delay line). The Up/Down input can be a simple digital input that causes the digital counter circuit 1110 to increment by 1 if asserted, or decrement by 1 if de-asserted on the next rising edge of a transition signal (e.g., PWM or $\overline{PWM}$). The digital counter circuit 1110 should not wrap the count value when a maximum count (all 1's) is reached. Upon reaching the maximum count, the count of the digital counter circuit should remain at all 1's on the next transition signal if the digital counter circuit was configured to count up. Likewise, when counting down and reaching all 0's, the count of the digital counter circuit 1110 should remain at 0 on the next transition signal if the digital counter circuit 1110 was configured to count down. This 5-bit example embodiment can be extended to as many bits as desired. This is a design consideration which may be made based on the usage of the system. Increased resolution and/or range both increases the effective number of bits in the delay counter and the number of delay stages in the delay line. Some elements of adjustable delay circuit 1100, though understood by one of ordinary skill in the art to be present, have been omitted from the simplified circuit schematic for simplicity.

Figure 11B:
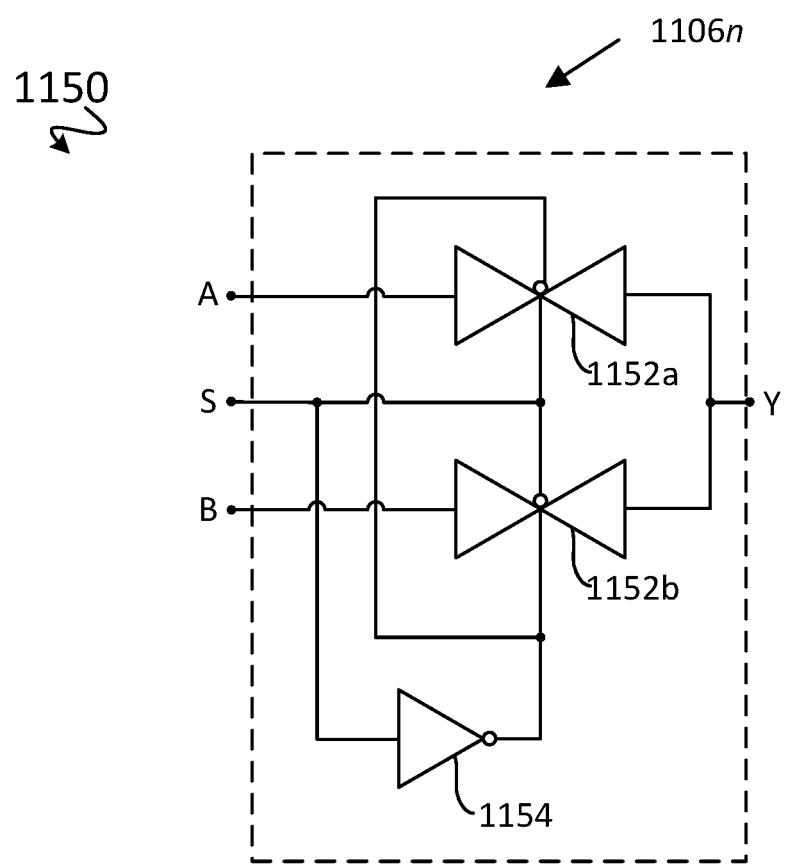
FIG. 11B is a simplified schematic of an example signal multiplexer circuit, in accordance with some embodiments.

In some embodiments, the signal muxing circuits 1106a-e are not logic gate based, as this may cause undesired propagation delays. In some embodiments, each of the signal muxing circuits 1106a-e is advantageously designed to contribute as little additional delay as possible to the signals received at inputs A and B when they are propagated to output Y. A simplified circuit schematic of a signal muxing circuit 1150 that contributes very little additional delay to the propagated signal is shown in FIG. 11B, however, other signal muxing circuits known in the art that are suitable for muxing signals as described are contemplated. The signal muxing circuit 1150 generally includes a selection input S, inputs A, B, and output Y. The asserted or de-asserted state of the selection input S configures the signal muxing circuit 1150 to either propagate a signal received at input A to output Y or to propagate a signal received at input B to output Y. The signal muxing circuit 1150 generally includes transmission gates 1152a-b and an inverter 1154.

Figure 12A:
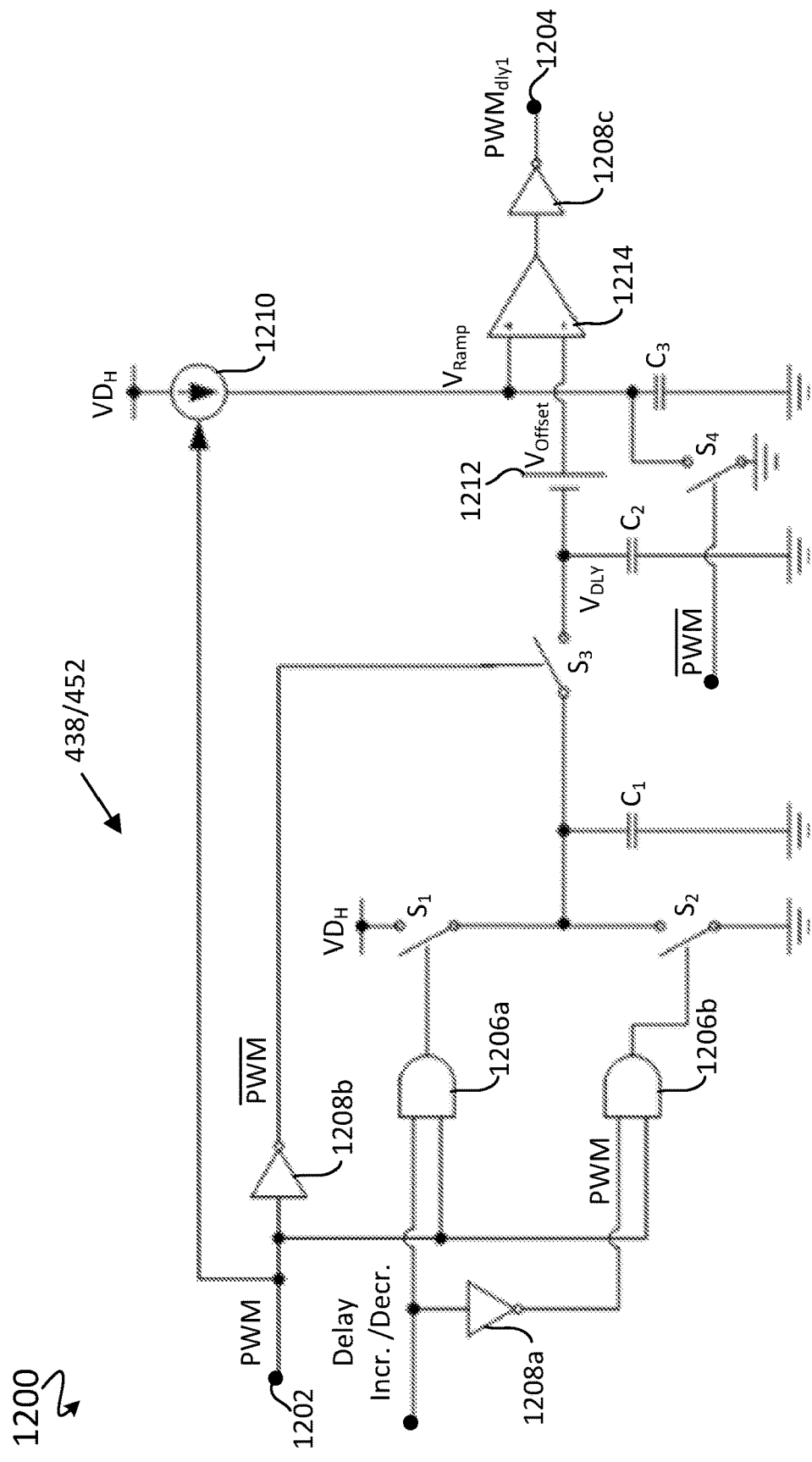
FIGS. 12A-B are simplified schematics of an example adjustable delay circuit, in accordance with some embodiments.

Though digital delay embodiments have been discussed, in some embodiments, an analog delay circuit is used as one or both of the adjustable delay circuits 438/452. FIG. 12A is a simplified circuit schematic of a portion of an adjustable delay circuit 1200, in accordance with some embodiments. The adjustable delay circuit 1200 generally includes a signal input node 1202, a signal output node 1204, AND gates 1206a-b, inverters 1208a-c, a current source circuit 1210, an offset voltage source 1212, a voltage comparison circuit 1214, switches $S_{1-4}$ and capacitors $C_{1-3}$. A signal (e.g., PWM or $\overline{PWM}$) is received at the signal input node 1202 and a signal having a delayed rising transition edge (e.g., PWMa Adj. Rise Dly. or PWMb Adj. Rise Dly.) is output from the signal output node 1204. The adjustable delay circuit 1200 is configured to increase or decrease the amount of variable delay applied to the rising transition edge based on a Delay Incr./Decr. signal received from a respective one of the delay guidance circuits 442, 456. As shown, an inverting input node of the voltage comparison circuit 1214 receives a reference voltage produced by a voltage ($V_{DLY}$) at a voltage reference node of the capacitor $C_2$ combined with a voltage offset ($V_{Offset}$) produced by the offset voltage source 1212. A non-inverting input node of the voltage comparison circuit 1214 is electrically coupled to the current source circuit 1210, the switch $S_4$, and to the capacitor $C_3$ which form a voltage ramp circuit. Based the received signal Delay Incr./Decr., the reference voltage ($V_{DLY}$) at the reference voltage node of the capacitor $C_2$ is increased to increase an adjustable delay value or decreased to decrease the adjustable delay value. Some elements of adjustable delay circuit 1200, though understood by one of ordinary skill in the art to be present, have been omitted from the simplified circuit schematic for simplicity.

Figure 12B:
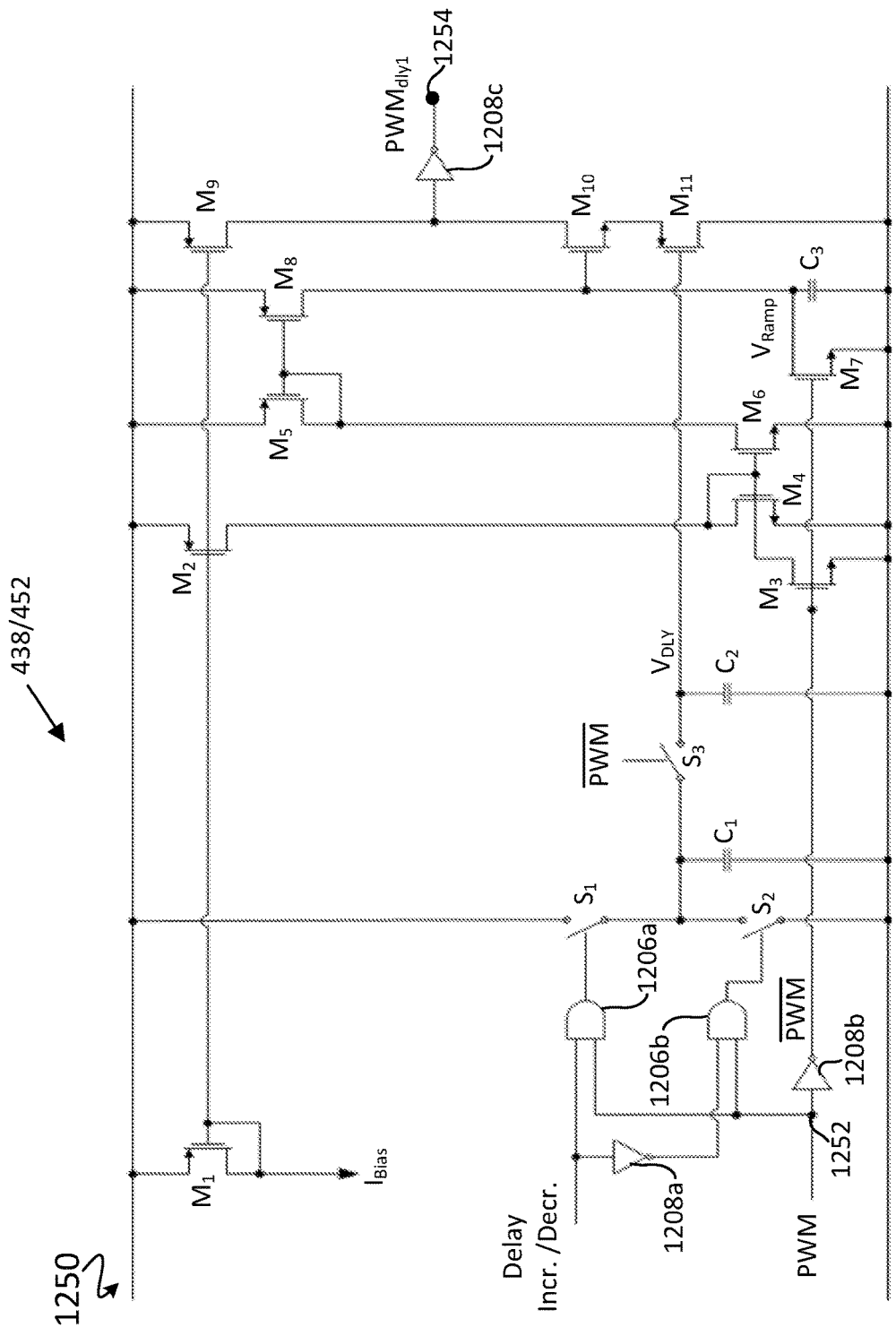

A simplified schematic of an adjustable delay circuit 1250 that implements elements of the adjustable delay circuit 1200 is shown in FIG. 12B. In accordance with some embodiments, one or both of the adjustable delay circuits 438/452 include circuitry similar to the adjustable delay circuit 1250. The adjustable delay circuit 1250 generally includes an input node 1252, an output node 1254, AND gates 1206a-b, inverters 1208a-c, switches $S_{1-3}$, capacitors $C_{1-3}$ and FETs $M_{1-11}$. A signal (e.g., PWM or $\overline{PWM}$) is received at the signal input node 1252 and a signal having a delayed rising transition edge (e.g., PWMa Adj. Rise Dly. or PWMb Adj. Rise Dly.) is output from the signal output node 1254. The adjustable delay circuit 1250 is configured to increase or decrease the amount of variable delay applied to the rising transition edge based on a Delay Incr./Decr. signal received from a respective one of the delay guidance circuits 442, 456. Some elements of adjustable delay circuit 1250, though understood by one of ordinary skill in the art to be present, have been omitted from the simplified circuit schematic for simplicity.

The preceding has described embodiments where the falling transition edges of both the high and low side drive gate drive signals are fixed in time with respect to the incoming PWM or command signal, and the rising transition edge delays are actively adjusted to minimize dead-time while preventing cross-conduction. It is also possible to rearrange the circuit elements so that other embodiments can be made to function in an equivalent manner. In some such embodiments, the delays of the rising and falling transition edges of the high-side gate drive signal are fixed, and the delay of the rising and falling transition edges of the low-side gate drive signal is adjusted. In some embodiments, the delays of the rising and falling transition edges of the low-side gate drive signal are fixed, and the delay of the rising and falling transition edges of the high-side gate drive signal is adjusted. In some embodiments, the rising transition edges of both the high and low side drive gate drive signals are fixed in time with respect to the incoming PWM or command signal and the falling transition edge delays are actively adjusted to minimize dead-time while preventing cross-conduction. For example, the fixed delay circuit 600 can be modified, in some embodiments, to delay a falling transition edge of a signal and not delay a rising transition edge of that signal. In some embodiments, the fixed delay circuits 440, 454 as have been described with reference to FIG. 4 are removed and the drive latch circuits 446, 460 are replaced with AND gates. This absolutely prevents cross-conduction (assuming equal turn on delays of the FETs 106, 110), but may not allow the converter 100 to reach optimum anti-cross-conduction interval times.

Reference has been made in detail to embodiments of the disclosed invention, one or more examples of which have been illustrated in the accompanying figures. Each example has been provided by way of explanation of the present technology, not as a limitation of the present technology. In fact, while the specification is described in detail with respect to specific embodiments of the invention, upon attaining an understanding of the foregoing it will be appreciated that those skilled in the art may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations of the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A circuit for minimizing an anti-cross-conduction time interval, the circuit comprising:
   a phase node;
   a high-side gate drive node;
   a low-side gate drive node;
   a high-side FET having a high-side gate node communicatively coupled to the high-side gate drive node;
   a low-side FET having a low-side gate node communicatively coupled to the low-side gate drive node, the high-side FET and the low-side FET being electrically coupled to the phase node;
   a high-side adjustable delay circuit communicatively coupled to the high-side gate drive node, the high-side adjustable delay circuit receiving a high-side gate drive signal having a first signal transition edge and transmitting a first delayed signal transition edge of a delayed high-side gate drive signal;
   a low-side adjustable delay circuit communicatively coupled to the low-side gate drive node, the low-side adjustable delay circuit receiving a low-side gate drive signal having a second signal transition edge and transmitting a second delayed signal transition edge of a delayed low-side gate drive signal;
   a high-side delay adjustment guidance circuit with a first sense input node electrically coupled to the phase node, a first latch input node communicatively coupled to the high-side gate drive node, and a first guidance signal output node communicatively coupled to the high-side adjustable delay circuit, the high-side delay adjustment guidance circuit outputting a high-side delay adjustment guidance signal based on a first detected body-diode conduction of the low-side FET detected during a first time period; and
   a low-side delay adjustment guidance circuit with a second sense input node electrically coupled to the phase node, a second latch input node communicatively coupled to the low-side gate drive node, and a second guidance signal output node communicatively coupled to the low-side adjustable delay circuit, the low-side delay adjustment guidance circuit outputting a low-side delay adjustment guidance signal based on a second detected body-diode conduction of the low-side FET detected during a second time period.

2. The circuit for minimizing an anti-cross-conduction time interval of claim 1, wherein:
   the first delayed signal transition edge is offset in time by a high-side adjustable delay from the first signal transition edge;
   the high-side adjustable delay is adjusted in duration by the high-side adjustable delay circuit based on the high-side delay adjustment guidance signal, the adjusted high-side adjustable delay being used during a subsequent switching cycle; and
   a delayed opposite signal transition edge of the delayed high-side gate drive signal is offset in time from an opposite signal transition edge of the high-side gate drive signal by a delay that is less than the high-side adjustable delay.

3. The circuit for minimizing an anti-cross-conduction time interval of claim 1, wherein:
   the second delayed signal transition edge is offset in time by a low-side adjustable delay from the second signal transition edge;
   the low-side adjustable delay is adjusted in duration by the low-side adjustable delay circuit based on the low-side delay adjustment guidance signal, the adjusted low-side adjustable delay being used during a subsequent switching cycle; and
   a delayed opposite signal transition edge of the delayed low-side gate drive signal is offset in time from an opposite signal transition edge of the low-side gate drive signal by a delay that is less than the low-side adjustable delay.

4. The circuit for minimizing an anti-cross-conduction time interval of claim 1, wherein:
   the high-side delay adjustment guidance signal is based on a comparison between a first voltage of the phase node and a first reference voltage during the first time period;
   the first time period occurs after the low-side FET has turned off and before the high-side FET has turned on;
   the low-side delay adjustment guidance signal is based on a voltage comparison between a second voltage of the phase node and a second reference voltage during the second time period;
   the second time period occurs after the high-side FET has turned off and before the low-side FET has turned on; and
   an absolute value of the first reference voltage is not equal to an absolute value of the second reference voltage.

5. The circuit for minimizing an anti-cross-conduction time interval of claim 1, wherein:
   the high-side delay adjustment guidance signal is based on a rate of change of a first voltage of the phase node with respect to time during the first time period;
   the first time period occurs after the low-side FET has turned off and before the high-side FET has turned on;
   the low-side delay adjustment guidance signal is based on a comparison between a second voltage of the phase node and a reference voltage during the second time period; and
   the second time period occurs after the high-side FET has turned off and before the low-side FET has turned on.

6. The circuit for minimizing an anti-cross-conduction time interval of claim 5, wherein:
   the high-side adjustable delay circuit is configured to decrease a duration of a high-side adjustable delay if the high-side delay adjustment guidance signal indicates that the rate of change of the first voltage of the phase node with respect to time is negative; and
   the high-side adjustable delay circuit is configured to increase a duration of the high-side adjustable delay if the high-side delay adjustment guidance signal indicates that the rate of change of the first voltage of the phase node with respect to time is positive.

7. The circuit for minimizing an anti-cross-conduction time interval of claim 1, wherein the high-side delay adjustment guidance circuit comprises:
a high-side voltage comparison circuit having an input electrically coupled to the first sense input node; and
a high-side voltage comparison signal latch circuit having an input communicatively coupled to an output of the high-side voltage comparison circuit, a latch-set input communicatively coupled to the first latch input node, and an output communicatively coupled to the first guidance signal output node.

8. The circuit for minimizing an anti-cross-conduction time interval of claim 7, wherein:
a signal state of the output of the high-side voltage comparison signal latch circuit is latched to a signal state of the input of the high-side voltage comparison signal latch circuit when a signal state of the high-side gate drive node transitions from a first high-side gate drive signal state to a second high-side gate drive signal state; and
the high-side delay adjustment guidance signal is based on the latched signal state.

9. The circuit for minimizing an anti-cross-conduction time interval of claim 1, wherein the low-side delay adjustment guidance circuit comprises:
a low-side voltage comparison circuit having an input electrically coupled to the second sense input node; and
a low-side voltage comparison signal latch circuit having an input communicatively coupled to an output of the low-side voltage comparison circuit, a latch-set input communicatively coupled to the second latch input node, and an output communicatively coupled to the second guidance signal output node.

10. The circuit for minimizing an anti-cross-conduction time interval of claim 9, wherein:
a signal state of the output of the low-side voltage comparison signal latch circuit is latched to a signal state of the input of the low-side voltage comparison signal latch circuit when a signal state of the low-side gate drive node transitions from a first low-side gate drive signal state to a second low-side gate drive signal state; and
the low-side delay adjustment guidance signal is based on the latched signal state.

11. The circuit for minimizing an anti-cross-conduction time interval of claim 1, further comprising:
a high-side gate drive signal latch circuit having a high-side latch-set input, a high-side latch-reset input, and a high-side latch output, the high-side latch-set input being communicatively coupled to the high-side adjustable delay circuit, and the high-side latch output being communicatively coupled to the high-side gate drive node;
a high-side fixed delay circuit communicatively coupled to the high-side latch-reset input, the high-side fixed delay circuit receiving the low-side gate drive signal and transmitting a high-side gate drive reset signal, wherein a signal transition edge of the high-side gate drive reset signal is offset in time by a high-side fixed delay from a corresponding signal transition edge of the low-side gate drive signal;
a low-side gate drive signal latch circuit having a low-side latch-set input, a low-side latch-reset input, and a low-side latch output, the low-side latch-set input being communicatively coupled to the low-side adjustable delay circuit, and the low-side latch output being communicatively coupled to the low-side gate drive node; and
a low-side fixed delay circuit communicatively coupled to the low-side latch-reset input, the low-side fixed delay circuit receiving the high-side gate drive signal and transmitting a low-side gate drive reset signal, wherein a signal transition edge of the low-side gate drive reset signal is offset in time by a low-side fixed delay from a corresponding signal transition edge of the high-side gate drive signal.

12. The circuit for minimizing an anti-cross-conduction time interval of claim 11, further comprising:
a reset signal node, the reset signal node being communicatively coupled to the high-side latch-reset input, the low-side latch-set input, the high-side adjustable delay circuit, and the low-side adjustable delay circuit.

13. The circuit for minimizing an anti-cross-conduction time interval of claim 12, wherein:
the high-side adjustable delay circuit receives a reset signal from the reset signal node, and upon receiving the reset signal sets a high-side adjustable delay to a maximum high-side delay value; and
the low-side adjustable delay circuit receives the reset signal from the reset signal node, and upon receiving the reset signal sets a low-side adjustable delay to a maximum low-side delay value.

14. The circuit for minimizing an anti-cross-conduction time interval of claim 1, further comprising:
a high-side fixed delay circuit communicatively coupled to the high-side gate drive node; and
a low-side fixed delay circuit communicatively coupled to the low-side gate drive node.

15. The circuit for minimizing an anti-cross-conduction time interval of claim 1, wherein one or both of the high-side adjustable delay circuit or the low-side adjustable delay circuit comprises:
a capacitor;
a voltage comparison circuit having a first input node electrically coupled to a reference voltage node of the capacitor; and
a voltage ramp circuit having a voltage ramp output being electrically coupled to a second input node of the voltage comparison circuit;
wherein a reference voltage at the reference voltage node of the capacitor is increased to increase an adjustable delay value; and
wherein the reference voltage at the reference voltage node of the capacitor is decreased to decrease the adjustable delay value.

16. A method for minimizing an anti-cross-conduction time interval, the method comprising:
determining if a low-side FET of a circuit is exhibiting body-diode conduction during a first time period of a first switching cycle;
receiving a delayed high-side FET gate drive signal at a high-side gate node of a high-side FET of the circuit, the high-side FET being coupled to the low-side FET at a phase node of the circuit, the delayed high-side FET gate drive signal having a first rising signal transition edge that is offset in time by a high-side adjustable delay from a corresponding first rising signal transition edge of a high-side FET gate drive signal;
configuring a high-side adjustable delay circuit to decrease the high-side adjustable delay if it is determined that the low-side FET exhibited body-diode conduction during the first time period, the decreased high-side adjustable delay being used in a second switching cycle;

configuring the high-side adjustable delay circuit to increase the high-side adjustable delay if it is determined that the low-side FET did not exhibit body-diode conduction during the first time period, the increased high-side adjustable delay being used in the second switching cycle;

determining if the low-side FET is exhibiting body-diode conduction during a second time period of the first switching cycle;

receiving a delayed low-side FET gate drive signal at a low-side gate node of the low-side FET, the delayed low-side FET gate drive signal having a second rising signal transition edge that is offset in time by a low-side adjustable delay from a corresponding second rising signal transition edge of a low-side FET gate drive signal;

configuring a low-side adjustable delay circuit to decrease the low-side adjustable delay if it is determined that the low-side FET exhibited body-diode conduction during the second time period, the decreased low-side adjustable delay being used in the second switching cycle; and configuring the low-side adjustable delay circuit to increase the low-side adjustable delay if it is determined that the low-side FET did not exhibit body-diode conduction during the second time period, the increased low-side adjustable delay being used in the second switching cycle.

17. The method of claim 16, wherein:
the first time period occurs after the low-side FET has turned off and before the high-side FET has turned on;
the determination during the first time period is based on a comparison between a first voltage of the phase node and a first reference voltage;
the second time period occurs after the high-side FET has turned off and before the low-side FET has turned on;
the determination during the second time period is based on a comparison between a second voltage of the phase node and a second reference voltage; and
an absolute value of the first reference voltage is not equal to an absolute value of the second reference voltage.

18. The method of claim 16, wherein:
the first time period occurs after the low-side FET has turned off and before the high-side FET has turned on;
the determination during the first time period is based on a rate of change of a first voltage of the phase node with respect to time;
the second time period occurs after the high-side FET has turned off and before the low-side FET has turned on; and
the determination during the second time period is based on a comparison between a second voltage of the phase node and a reference voltage.

19. The method of claim 16, wherein:
a first falling signal transition edge of the delayed high-side FET gate drive signal is offset in time from a corresponding first falling signal transition edge of the high-side FET gate drive signal by a duration that is less than the high-side adjustable delay; and
a second falling signal transition edge of the delayed low-side FET gate drive signal is offset in time from a corresponding second falling signal transition edge of the low-side FET gate drive signal by a duration that is less than the low-side adjustable delay.

20. The method of claim 16, the method further comprising:
receiving another delayed high-side FET gate drive signal at the high-side gate node of the high-side FET, the other delayed high-side FET gate drive signal having a falling signal transition edge that is offset in time by a high-side fixed delay from a corresponding rising signal transition edge of the low-side FET gate drive signal; and
receiving another delayed low-side FET gate drive signal at the low-side gate node of the low-side FET, the other delayed low-side FET gate drive signal having a falling signal transition edge that is offset in time by a low-side fixed delay from a corresponding rising signal transition edge of the high-side FET gate drive signal.

* * * * *